(12) United States Patent
Beall et al.

(10) Patent No.: US 10,723,649 B2
(45) Date of Patent: Jul. 28, 2020

(54) BLACK LITHIUM SILICATE GLASS CERAMICS

(71) Applicant: CORNING INCORPORATED, Corning, NY (US)

(72) Inventors: George Halsey Beall, Big Flats, NY (US); Qiang Fu, Painted Post, NY (US); Charlene Marie Smith, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 16/202,629

(22) Filed: Nov. 28, 2018

(65) Prior Publication Data
US 2019/0161395 A1    May 30, 2019

Related U.S. Application Data

(60) Provisional application No. 62/592,715, filed on Nov. 30, 2017.

(51) Int. Cl.
| | |
|---|---|
| *C03C 10/04* | (2006.01) |
| *C03C 10/12* | (2006.01) |
| *C03C 10/14* | (2006.01) |
| *H05K 5/03* | (2006.01) |
| *C03C 10/00* | (2006.01) |
| *C03C 4/18* | (2006.01) |
| *H05K 5/00* | (2006.01) |
| *C03C 4/02* | (2006.01) |
| *C03C 3/097* | (2006.01) |
| *C03C 21/00* | (2006.01) |

(52) U.S. Cl.
CPC .......... *C03C 10/0027* (2013.01); *C03C 3/097* (2013.01); *C03C 4/02* (2013.01); *C03C 4/18* (2013.01); *C03C 10/0054* (2013.01); *H05K 5/0017* (2013.01); *H05K 5/03* (2013.01); *C03C 21/002* (2013.01); *C03C 2204/00* (2013.01)

(58) Field of Classification Search
CPC . C03C 10/0027; C03C 10/0009; C03C 10/00; H05K 5/03
See application file for complete search history.

(56) References Cited

U.S. PATENT DOCUMENTS

| | | |
|---|---|---|
| 3,681,097 A | 8/1972 | Beall |
| 5,070,044 A | 12/1991 | Pinckney |
| (Continued) | | |

FOREIGN PATENT DOCUMENTS

| | | |
|---|---|---|
| CN | 107915412 A | 4/2018 |

OTHER PUBLICATIONS

International Search Report and Written Opinion PCT/US2018/063109 dated Mar. 18, 2019, 13 Pgs.
(Continued)

*Primary Examiner* — Karl E Group
(74) *Attorney, Agent, or Firm* — Kevin M. Johnson

(57) ABSTRACT

A black lithium silicate glass ceramic is provided. The glass ceramic includes lithium silicate as a primary crystal phase and at least one of petalite, β-quartz, β-spodumene, cristobalite, and lithium phosphate as a secondary crystal phase. The glass ceramic is characterized by the color coordinates: L*: 20.0 to 40.0, a*: −1.0 to 1.0, and b*: −5.0 to 2.0. The glass ceramic may be ion exchanged. Methods for producing the glass ceramic are also provided.

23 Claims, 6 Drawing Sheets

(56) References Cited

U.S. PATENT DOCUMENTS

| | | | |
|---|---|---|---|
| 5,173,453 | A | 12/1992 | Beall et al. |
| 5,512,520 | A | 4/1996 | Pfitzenmaier |
| 7,476,633 | B2 | 1/2009 | Comte et al. |
| 8,068,816 | B2 | 11/2011 | Vander Veen |
| 8,664,130 | B2 | 3/2014 | Beall et al. |
| 9,260,342 | B2 * | 2/2016 | Borczuch-Laczka ........................ A61K 6/833 |
| 9,701,573 | B2 | 7/2017 | Beall et al. |
| 2005/0016521 | A1 | 1/2005 | Witzmann et al. |
| 2014/0141960 | A1 * | 5/2014 | Borczuch-Laczka ........................ C03C 3/083 501/32 |
| 2014/0194270 | A1 | 7/2014 | Shiratori et al. |
| 2015/0239772 | A1 | 8/2015 | Baker et al. |
| 2015/0321947 | A1 | 11/2015 | Beall et al. |
| 2016/0102010 | A1 | 4/2016 | Beall et al. |
| 2016/0102011 | A1 | 4/2016 | Hu et al. |

OTHER PUBLICATIONS

Beall and Pinckney, "Nanophase glass-ceramics," Journal of the American Ceramic Society, 1999, 82(1): pp. 5-16.

Bubsey et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992).

Dejneka, et al. "Chemically strengthened low crystallinity black glass-ceramics with high liquidus viscosity" International Journal of Applied Glass Science, 2014, 5(2): pp. 146-160.

Hummel, "Thermal expansion properties of some synthetic lithia minerals," Journal of the American Ceramic Society, 1951, 34(8): pp. 235-239.

Park et al., "Heat-resistant ceramics based on LAS-system nonmetallic mineral and its thermal shock resistance," Journal of the Ceramic Society of Japan, 2010, 118 (3): pp. 220-225.

Reddy et al, "Fracture Toughness Measurement of Glass and Ceramic Materials Using Chevron-Notched Specimens," Journal of the American Ceramic Society, 1988, 71(6): pp. C-310-C-313.

Shelby, "Chapter 10: Optical Properties" in Introduction to Glass Science and Technology, pp. 202-221. the Royal Society of Chemistry, 2005, Cambridge, UK.

Varshneya, "Chapter 19: Optical Properties" in Fundamentals of Inorganic Glasses, Academic Press Inc. 1994, pp. 455-506, San Diego, CA.

\* cited by examiner

BLACK LITHIUM SILICATE GLASS CERAMICS

CROSS-REFERENCE TO RELATED APPLICATIONS

This application claims the benefit of priority of U.S. Provisional Application Ser. No. 62/592,715 filed on Nov. 30, 2017, the contents of which are relied upon and incorporated herein by reference in their entirety.

BACKGROUND

Field

The present specification generally relates to glass ceramic compositions. More specifically, the present specification is directed to black lithium silicate glass ceramics that may be formed into housings for electronic devices.

Technical Background

Portable electronic devices, such as, smartphones, tablets, and wearable devices (such as, for example, watches and fitness trackers) continue to get smaller and more complex. As such, materials that are conventionally used on at least one external surface of such portable electronic devices also continue to get more complex. For instance, as portable electronic devices get smaller and thinner to meet consumer demand, the housings used in these portable electronic devices also get smaller and thinner, resulting in higher performance requirements for the materials used to form these components.

Accordingly, a need exists for materials that exhibit higher performance, such as resistance to damage, and a pleasing appearance for use in portable electronic devices.

SUMMARY

According to aspect (1), a glass ceramic is provided. The glass ceramic comprises: at least one lithium silicate crystal phase as a primary crystal phase; and at least one of petalite, β-quartz, β-spodumene, cristobalite, and lithium phosphate as a secondary crystal phase. The glass ceramic is characterized by the following color coordinates: L*: 20.0 to 40.0; a*: −1.0 to 1.0; and b*: −5.0 to 2.0.

According to aspect (2), the glass ceramic of aspect (1) is provided, wherein the primary crystal phase is a lithium metasilicate.

According to aspect (3), the glass ceramic of aspect (1) or (2) is provided, wherein the primary crystal phase is lithium disilicate.

According to aspect (4), the glass ceramic of any of aspects (1) to (3) is provided, wherein the glass ceramic has a transmittance of less than about 1% in the visible light range.

According to aspect (5), the glass ceramic of any of aspects (1) to (4) is provided, wherein the glass ceramic has a ring-on-ring strength of at least about 290 MPa.

According to aspect (6), the glass ceramic of any of aspects (1) to (5) is provided, wherein the glass ceramic has a fracture toughness of about 0.9 MPa·m$^{0.5}$ to about 2.0 MPa·m$^{0.5}$.

According to aspect (7), the glass ceramic of any of aspects (1) to (6) is provided, wherein the glass ceramic has a fracture toughness of about 1.0 MPa·m$^{0.5}$ to about 1.5 MPa·m$^{0.5}$.

According to aspect (8), the glass ceramic of any of aspects (1) to (7) is provided, further comprising: about 55.0 wt % to about 75.0 wt % $SiO_2$; about 2.0 wt % to about 20.0 wt % $Al_2O_3$; 0 wt % to about 5.0 wt % $B_2O_3$; about 5.0 wt % to about 15.0 wt % $Li_2O$; 0 wt % to about 5.0 wt % $Na_2O$; 0 wt % to about 4.0 wt % $K_2O$; 0 wt % to about 8.0 wt % MgO; 0 wt % to about 10.0 wt % ZnO; about 0.5 wt % to about 5.0 wt % $TiO_2$; about 1.0 wt % to about 6.0 wt % $P_2O_5$; about 2.0 wt % to about 10.0 wt % $ZrO_2$; 0 wt % to about 0.4 wt % $CeO_2$; about 0.05 wt % to about 0.5 wt % $SnO+SnO_2$; about 0.1 wt % to about 5.0 wt % $FeO+Fe_2O_3$; about 0.1 wt % to about 5.0 wt % NiO; about 0.1 wt % to about 5.0 wt % $Co_3O_4$; 0 wt % to about 4.0 wt % $MnO+MnO_2+Mn_2O_3$; 0 wt % to about 2.0 wt % $Cr_2O_3$; 0 wt % to about 2.0 wt % CuO; and 0 wt % to about 2.0 wt % $V_2O_5$.

According to aspect (9), the glass ceramic of any of aspects (1) to (8) is provided, further comprising: about 65.0 wt % to about 75.0 wt % $SiO_2$; about 7.0 wt % to about 11.0 wt % $Al_2O_3$; about 6.0 wt % to about 11.0 wt % $Li_2O$; about 2.0 wt % to about 4.0 wt % $TiO_2$; about 1.5 wt % to about 2.5 wt % $P_2O_5$; about 2.0 wt % to about 4.0 wt % $ZrO_2$; about 1.0 wt % to about 4.0 wt % $FeO+Fe_2O_3$; about 0.5 wt % to about 1.5 wt % NiO; and about 0.1 wt % to about 0.4 wt % $Co_3O_4$.

According to aspect (10), the glass ceramic of any of aspects (1) to (9) is provided, wherein the glass ceramic has a crystallinity of greater than about 50 wt %.

According to aspect (11), the glass ceramic of any of aspects (1) to (10) is provided, wherein the glass ceramic is ion exchanged and comprises a compressive stress layer extending from a surface of the glass ceramic to a depth of compression.

According to aspect (12), the glass ceramic of aspect (11) is provided, wherein the glass ceramic has a compressive stress at the surface of at least about 250 MPa.

According to aspect (13), the glass ceramic of aspect (11) or (12) is provided, wherein the glass ceramic has a compressive stress at the surface of about 250 MPa to about 650 MPa.

According to aspect (14), the glass ceramic of any of aspects (11) to (13) is provided, wherein the depth of compression is at least 0.05t, where t is a thickness of glass ceramic.

According to aspect (15), the glass ceramic of any of aspects (11) to (14) is provided, wherein the glass ceramic has a ring-on-ring strength of at least about 900 MPa.

According to aspect (16), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of any of aspects (1) to (10).

According to aspect (17), a consumer electronic product is provided. The consumer electronic product comprises: a housing comprising a front surface, a back surface and side surfaces; electrical components at least partially within the housing, the electrical components comprising at least a controller, a memory, and a display, the display at or adjacent the front surface of the housing; and a cover glass disposed over the display. At least a portion of the housing comprises the glass ceramic of any of aspects (11) to (15).

According to aspect (18), a method is provided. The method comprises: ceramming a precursor glass-based article to form a glass ceramic. The glass ceramic comprises:

at least one lithium silicate crystal phase as a primary crystal phase; and at least one of petalite, β-quartz, β-spodumene, cristobalite, and lithium phosphate as a minor crystal phase. The glass ceramic is characterized by the following color coordinates: L*: 20.0 to 40.0; a*: −1.0 to 1.0; and b*: −5.0 to 2.0.

According to aspect (19), the method of aspect (18) is provided, wherein the ceramming occurs at a temperature of about 500° C. to about 900° C.

According to aspect (20), the method of aspect (18) or (19) is provided, wherein the ceramming occurs for a period of about 6 hours to about 16 hours.

According to aspect (21), the method of any of aspects (18) to (20) is provided, further comprising ion exchanging the glass ceramic.

According to aspect (22), the method of any of aspects (18) to (21) is provided, wherein the precursor glass-based article comprises: about 55.0 wt % to about 75.0 wt % $SiO_2$; about 2.0 wt % to about 20.0 wt % $Al_2O_3$; 0 wt % to about 5.0 wt % $B_2O_3$; about 5.0 wt % to about 15.0 wt % $Li_2O$; 0 wt % to about 5.0 wt % $Na_2O$; 0 wt % to about 4.0 wt % $K_2O$; 0 wt % to about 8.0 wt % MgO; 0 wt % to about 10.0 wt % ZnO; about 0.5 wt % to about 5.0 wt % $TiO_2$; about 1.0 wt % to about 6.0 wt % $P_2O_5$; about 2.0 wt % to about 10.0 wt % $ZrO_2$; 0 wt % to about 0.4 wt % $CeO_2$; about 0.05 wt % to about 0.5 wt % $SnO+SnO_2$; about 0.1 wt % to about 5.0 wt % $FeO+Fe_2O_3$; about 0.1 wt % to about 5.0 wt % NiO; about 0.1 wt % to about 5.0 wt % $Co_3O_4$; 0 wt % to about 4.0 wt % $MnO+MnO_2+Mn_2O_3$; 0 wt % to about 2.0 wt % $Cr_2O_3$; 0 wt % to about 2.0 wt % CuO; and 0 wt % to about 2.0 wt % $V_2O_5$.

According to aspect (23), the method of any of aspects (18) to (22) is provided, wherein the precursor glass-based article comprises: about 65.0 wt % to about 75.0 wt % $SiO_2$; about 7.0 wt % to about 11.0 wt % $Al_2O_3$; about 6.0 wt % to about 11.0 wt % $Li_2O$; about 2.0 wt % to about 4.0 wt % $TiO_2$; about 1.5 wt % to about 2.5 wt % $P_2O_5$; about 2.0 wt % to about 4.0 wt % $ZrO_2$; about 1.0 wt % to about 4.0 wt % $FeO+Fe_2O_3$; about 0.5 wt % to about 1.5 wt % NiO; and about 0.1 wt % to about 0.4 wt % $Co_3O_4$.

According to aspect (24), a glass is provided. The glass comprises: about 55.0 wt % to about 75.0 wt % $SiO_2$; about 2.0 wt % to about 20.0 wt % $Al_2O_3$; 0 wt % to about 5.0 wt % $B_2O_3$; about 5.0 wt % to about 15.0 wt % $Li_2O$; 0 wt % to about 5.0 wt % $Na_2O$; 0 wt % to about 4.0 wt % $K_2O$; 0 wt % to about 8.0 wt % MgO; 0 wt % to about 10.0 wt % ZnO; about 0.5 wt % to about 5.0 wt % A $TiO_2$; about 1.0 wt % to about 6.0 wt % A $P_2O_5$; about 2.0 wt % to about 10.0 wt % $ZrO_2$; 0 wt % to about 0.4 wt % $CeO_2$; about 0.05 wt % to about 0.5 wt % $SnO+SnO_2$; about 0.1 wt % to about 5.0 wt % A $FeO+Fe_2O_3$; about 0.1 wt % to about 5.0 wt % A NiO; about 0.1 wt % to about 5.0 wt % $Co_3O_4$; 0 wt % to about 4.0 wt % $MnO+MnO_2+Mn_2O_3$; 0 wt % to about 2.0 wt % A $Cr_2O_3$; 0 wt % to about 2.0 wt % A CuO; and 0 wt % to about 2.0 wt % A $V_2O_5$.

According to aspect (25), the glass of aspect (24) is provided, comprising: about 65.0 wt % to about 75.0 wt % A $SiO_2$; about 7.0 wt % to about 11.0 wt % $Al_2O_3$; about 6.0 wt % to about 11.0 wt % $Li_2O$; about 2.0 wt % to about 4.0 wt % $TiO_2$; about 1.5 wt % to about 2.5 wt % $P_2O_5$; about 2.0 wt % to about 4.0 wt % $ZrO_2$; about 1.0 wt % to about 4.0 wt % $FeO+Fe_2O_3$; about 0.5 wt % to about 1.5 wt % NiO; and about 0.1 wt % to about 0.4 wt % $Co_3O_4$.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein and, together with the description, serve to explain the principles and operations of the claimed subject matter.

DETAILED DESCRIPTION

Figure 1:
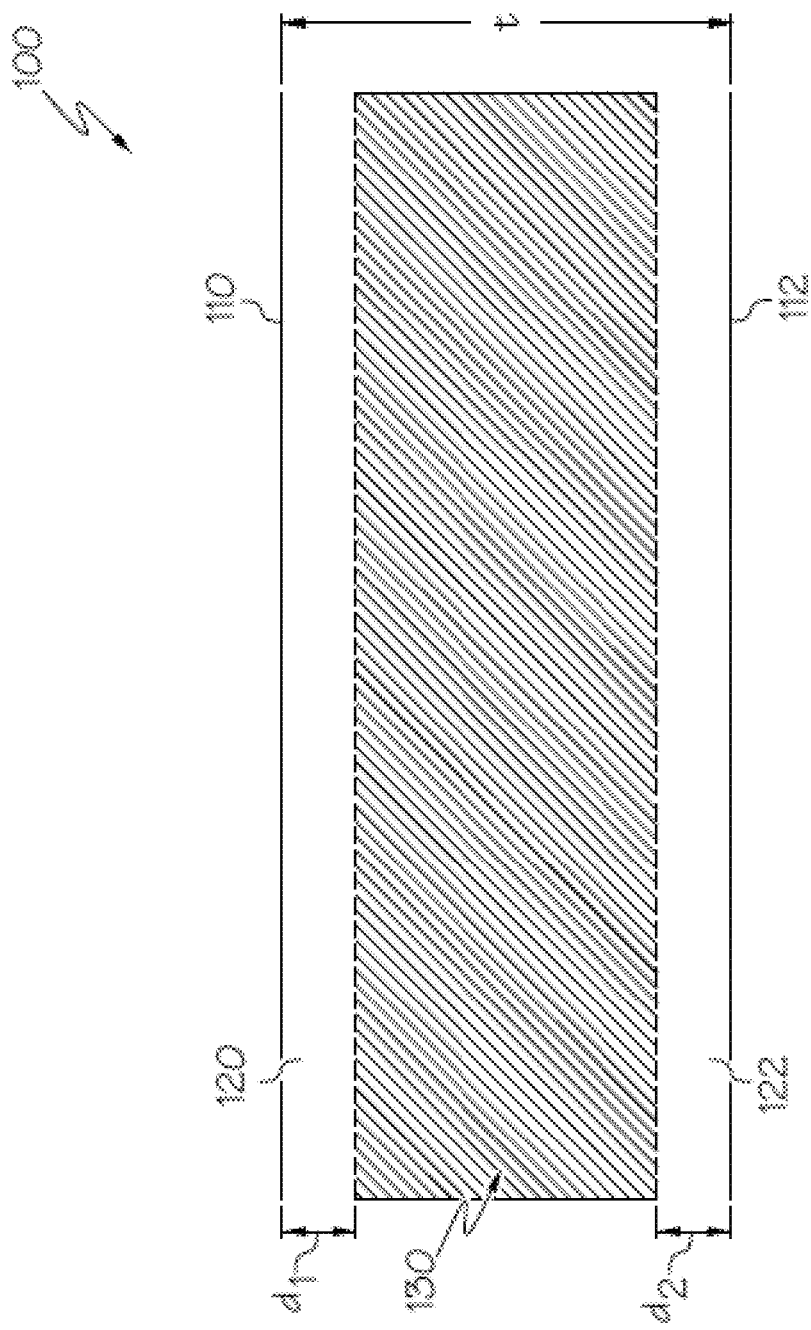
FIG. 1 schematically depicts a cross section of a glass ceramic having compressive stress layers on surfaces thereof according to embodiments disclosed and described herein.

Reference will now be made in detail to black lithium silicate glass ceramics according to various embodiments. In particular, the black lithium silicate glass ceramics have a pleasing appearance, and exhibit high strength and fracture toughness. Therefore, the black lithium silicate glass ceramics are suited for use as housings in portable electronic devices.

In the following description, like reference characters designate like or corresponding parts throughout the several views shown in the figures. It is also understood that, unless otherwise specified, terms such as "top," "bottom," "outward," "inward," and the like are words of convenience and are not to be construed as limiting terms. Whenever a group is described as consisting of at least one of a group of elements or combinations thereof, it is understood that the group may consist of any number of those elements recited, either individually or in combination with each other. Unless otherwise specified, a range of values, when recited, includes both the upper and lower limits of the range as well as any ranges therebetween. As used herein, the indefinite articles "a," "an," and the corresponding definite article "the" mean "at least one" or "one or more," unless otherwise specified. It also is understood that the various features disclosed in the specification and the drawings can be used in any and all combinations.

Unless otherwise specified, all compositions of the glasses described herein are expressed in terms of weight percent (wt %), and the constituents are provided on an oxide basis. Unless otherwise specified, all temperatures are expressed in terms of degrees Celsius (° C.).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. For example, a glass that is "substantially free of $K_2O$" is one in which $K_2O$ is not actively added or batched into the glass, but may be present in very small amounts as a contaminant, such as in amounts of less than about 0.01 wt %. As utilized herein, when the term "about" is used to modify a value, the exact value is also disclosed.

The glass ceramics contain a primary crystal phase, a secondary crystal phase, and a residual glass phase. The primary crystal phase is the predominant crystal phase, defined herein as the crystal phase that accounts for the largest fraction of the glass ceramic by weight. Accordingly, the secondary crystal phase is present in a concentration in terms of weight percent of the glass ceramic that is less than the weight percent of the primary crystal phase.

In embodiments, the primary crystal phase includes lithium silicate. The lithium silicate may be lithium metasilicate or lithium disilicate. In embodiments, the lithium silicate is the only primary crystal phase.

In some embodiments, the glass ceramic includes a secondary crystal phase including at least one of petalite, β-quartz, β-spodumene, cristobalite, and lithium phosphate. As utilized herein, β-spodumene may refer to β-spodumene solid solutions. In embodiments, the glass ceramic contains more than one secondary crystal phase. In some embodiments, additional crystal phases may be present in the glass ceramic.

In embodiments, the total crystallinity of the glass ceramic is high enough to provide enhanced mechanical properties, such as hardness, Young's modulus, and scratch resistance. As utilized herein, the total crystallinity is provided in wt % and refers to the sum of the wt % of all the crystal phases present in the glass ceramic. In embodiments, the total crystallinity is greater than or equal to about 50 wt %, such as greater than or equal to about 55 wt %, greater than or equal to about 60 wt %, greater than or equal to about 65 wt %, greater than or equal to about 70 wt %, greater than or equal to about 75 wt %, or more. It should be understood that, in embodiments, any of the above ranges may be combined with any other range. In embodiments, the total crystallinity of the glass ceramic is from greater than or equal to about 50 wt % to less than or equal to about 75 wt %, such as greater than or equal to about 55 wt % to less than or equal to about 70 wt %, or greater than or equal to about 60 wt % to less than or equal to about 65 wt %, and all ranges and sub-ranges between the foregoing values. The total crystallinity of the glass ceramic is determined through Rietveld quantitative analysis of X-ray diffraction (XRD) results.

The glass ceramics are opaque or translucent. In embodiments, the glass ceramics exhibit a transmittance of less than about 10% in the visible range (380 nm to 760 nm), such as less than about 9%, less than about 8%, less than about 7%, less than about 6%, less than about 5%, less than about 4%, less than about 3%, less than about 2%, less than about 1%, or less. The transmittance as utilized herein refers to total transmittance, and is measured using a Perkin Elmer Lambda 950 UV/Vis/NIR spectrophotometer with a 150 mm integrating sphere. The samples are mounted at the sphere's entrance port, which allows for the collection of wide angle scattered light, and a reference Spectralon reflectance disc is located over the sphere's exit port. The total transmittance is generated relative to an open beam baseline measurement.

In embodiments, the glass ceramics are black. The glass ceramics may be characterized by the following color coordinates: L* 20.0 to 40.0, a* −1.0 to 0.5, and b* −5.0 to 1.0. In some embodiments, the L* value of the glass ceramic may be from 20.0 to 40.0, such as from 21.0 to 39.0, from 22.0 to 38.0, from 23.0 to 37.0, from 24.0 to 36.0, from 23.0 to 35.0, from 25.0 to 34.0, from 26.0 to 33.0, from 27.0 to 32.0, from 28.0 to 31.0, or from 29.0 to 30.0%, and all ranges and sub-ranges between the foregoing values. In some embodiments, the a* value of the glass ceramic may be from −1.0 to 1.0, such as from −0.9 to 0.9, from −0.8 to 0.8, from −0.7 to 0.7, from −0.6 to 0.6, from −0.5 to 0.5, from −0.4 to 0.4, from −0.3 to 0.3, from −0.2 to 0.2, or from −0.1 to 0.1, and all ranges and sub-ranges between the foregoing values. In some embodiments, the b* value of the glass ceramic may be from −5.0 to 2.0, such as from −4.5 to 1.5, from −4.0 to 1.0, from −3.5 to 0.5, from −3.0 to 0.0, from −2.5 to −0.5, from −2.0 to −1.0, or −1.5, and all ranges and sub-ranges between the foregoing values. As utilized herein, the color coordinates are measured using an X-rite Ci7 F02 illuminant under SCI UVC conditions.

In embodiments, the glass ceramic may have a high fracture toughness. The high fracture toughness is achieved at least in part due to the crystal phase assemblage of the glass ceramic. In some embodiments, the glass ceramic may have a fracture toughness of greater than or equal to about 0.9 MPa·m$^{0.5}$ to less than or equal to about 2.0 MPa·m$^{0.5}$, such as greater than or equal to about 1.0 MPa·m$^{0.5}$ to less than or equal to about 1.9 MPa·m$^{0.5}$, greater than or equal to about 1.1 MPa·m$^{0.5}$ to less than or equal to about 1.8 MPa·m$^{0.5}$, greater than or equal to about 1.2 MPa·m$^{0.5}$ to less than or equal to about 1.7 MPa·m$^{0.5}$, greater than or equal to about 1.3 MPa·m$^{0.5}$ to less than or equal to about 1.6 MPa·m$^{0.5}$, greater than or equal to about 1.4 MPa·m$^{0.5}$ to less than or equal to about 1.5 MPa·m$^{0.5}$, and all ranges and sub-ranges between the foregoing values. In some embodiments, the glass ceramic may have a fracture toughness of greater than or equal to about 1.0 MPa·m$^{0.5}$ to less than or equal to about 1.5 MPa·m$^{0.5}$. The fracture toughness is measured by chevron notched short bar (CNSB) method, as described below.

In embodiments, the glass ceramic may have a high strength. The high strength is achieved at least in part due to the crystal phase assemblage of the glass ceramic. In some embodiments, the glass ceramic has a strength of greater than or equal to about 290 MPa, such as greater than or equal to about 300 MPa, greater than or equal to about 310 MPa, greater than or equal to about 320 MPa, greater than or equal to about 330 MPa, greater than or equal to about 340 MPa, greater than or equal to about 350 MPa, greater than or equal to about 360 MPa, greater than or equal to about 370 MPa, greater than or equal to about 380 MPa, greater than or equal to about 390 MPa, or more. In embodiments, the glass ceramic has a strength of greater than or equal to about 290 MPa to less than or equal to about 400 MPa, such as greater than or equal to about 300 MPa to less than or equal to about 390 MPa, greater than or equal to about 310 MPa to less than or equal to about 380 MPa, greater than or equal to about 320 MPa to less than or equal to about 370 MPa, greater than or equal to about 330 MPa to less than or equal to about 360 MPa, greater than or equal to about 340 MPa to less than or equal to about 350 MPa, and any and all sub-ranges formed from these endpoints. The strength refers to the strength as measured by the ring-on-ring test described below.

The composition of the lithium silicate glass ceramics will now be described. In embodiments of glass ceramics described herein, the concentration of constituent components (e.g., $SiO_2$, $Al_2O_3$, $Li_2O$, $Na_2O$ and the like) are given in weight percent (wt %) on an oxide basis, unless otherwise specified. Components of the glass ceramics according to embodiments are discussed individually below. It should be understood that any of the variously recited ranges of one component may be individually combined with any of the variously recited ranges for any other component.

In embodiments of the glass ceramics disclosed herein, $SiO_2$ is the largest constituent. The $SiO_2$ acts as the primary network former and stabilizes the network structure. The $SiO_2$ is necessary for the formation of the desired lithium silicate crystal phase. Pure $SiO_2$ has a relatively low CTE and is alkali free. However, pure $SiO_2$ has a high melting point. Accordingly, if the concentration of $SiO_2$ in the glass ceramic is too high, the formability of the precursor glass composition used to form the glass ceramics may be diminished as higher concentrations of $SiO_2$ increase the difficulty of melting the glass, which, in turn, adversely impacts the formability of the precursor glass. In embodiments, the glass composition generally comprises $SiO_2$ in an amount greater than or equal to about 55.0 wt %, such as greater than or equal to about 56.0 wt %, greater than or equal to about 57.0 wt %, greater than or equal to about 58.0 wt %, greater than or equal to about 59.0 wt %, greater than or equal to about 60.0 wt %, greater than or equal to about 61.0 wt %, greater than or equal to about 62.0 wt %, greater than or equal to about 63.0 wt %, greater than or equal to about 64.0 wt %, greater than or equal to about 65.0 wt %, greater than or equal to about 66.0 wt %, greater than or equal to about 67.0 wt %, greater than or equal to about 68.0 wt %, greater than or equal to about 69.0 wt %, greater than or equal to about 70.0 wt %, greater than or equal to about 71.0 wt %, greater than or equal to about 72.0 wt %, greater than or equal to about 73.0 wt %, or greater than or equal to about 74.0 wt %. In embodiments, the glass composition comprises $SiO_2$ in amounts less than or equal to about 75.0 wt %, such as less than or equal to about 74.0 wt %, less than or equal to about 73.0 wt %, less than or equal to about 72.0 wt %, or less than or equal to about 71.0 wt %, less than or equal to about 70.0 wt %, less than or equal to about 69.0 wt %, less than or equal to about 68.0 wt %, less than or equal to about 67.0 wt %, less than or equal to about 66.0 wt %, less than or equal to about 65.0 wt %, less than or equal to about 64.0 wt %, less than or equal to about 63.0 wt %, less than or equal to about 62.0 wt %, less than or equal to about 61.0 wt %, less than or equal to about 60.0 wt %, less than or equal to about 59.0 wt %, less than or equal to about 58.0 wt %, less than or equal to about 57.0 wt %, or less than or equal to about 56.0 wt %. It should be understood that, in embodiments, any of the above ranges may be combined with any other range. In embodiments, the glass composition comprises $SiO_2$ in an amount from greater than or equal to about 55.0 wt % to less than or equal to about 75.0 wt %, such as from greater than or equal to about 56.0 wt % to less than or equal to about 74.0 wt %, from greater than or equal to about 57.0 wt % to less than or equal to about 73.0 wt %, from greater than or equal to about 58.0 wt % to less than or equal to about 72.0 wt %, from greater than or equal to about 59.0 wt % to less than or equal to about 71.0 wt %, from greater than or equal to about 60.0 wt % to less than or equal to about 70.0 wt %, from greater than or equal to about 61.0 wt % to less than or equal to about 69.0 wt %, from greater than or equal to about 62.0 wt % to less than or equal to about 68.0 wt %, from greater than or equal to about 63.0 wt % to less than or equal to about 67.0 wt %, from greater than or equal to about 64.0 wt % to less than or equal to about 66.0 wt %, or about 65.0 wt %, and all ranges and sub-ranges between the foregoing values. In some embodiments, the glass ceramic includes $SiO_2$ in an amount from greater than or equal to about 65 wt % to less than or equal to about 75 wt %.

The glass ceramics of embodiments may further comprise $Al_2O_3$. $Al_2O_3$ may increase the viscosity of the precursor glass compositions used to form the glass ceramics due to its tetrahedral coordination in a glass melt formed from a glass composition, decreasing the formability of the glass composition when the amount of $Al_2O_3$ is too high. However, when the concentration of $Al_2O_3$ is balanced against the concentration of $SiO_2$ and the concentration of alkali oxides in the glass composition, $Al_2O_3$ can reduce the liquidus temperature of the glass melt, thereby enhancing the liquidus viscosity and improving the compatibility of the glass composition with certain forming processes, such as the fusion forming process. However, if the $Al_2O_3$ content is too high, the amount of lithium disilicate crystals formed in the glass ceramic may be undesirably decreased, preventing the formation of an interlocking structure. Similarly to the $SiO_2$, the $Al_2O_3$ stabilizes the network structure. In embodiments, the glass composition generally comprises $Al_2O_3$ in a concentration of greater than or equal to about 2.0 wt %, such as greater than or equal to about 3.0 wt %, greater than or equal to about 4.0 wt %, greater than or equal to about 5.0 wt %, greater than or equal to about 6.0 wt %, greater than or equal to about 7.0 wt %, greater than or equal to about 8.0 wt %, greater than or equal to about 9.0 wt %, greater than or equal to about 10.0 wt %, greater than or equal to about 11.0 wt %, greater than or equal to about 12.0 wt %, greater than or equal to about 13.0 wt %, greater than or equal to about 14.0 wt %, greater than or equal to about 15.0 wt %, greater than or equal to about 16.0 wt %, greater than or equal to about 17.0 wt %, greater than or equal to about 18.0 wt %, or greater than or equal to about 19.0 wt %. In embodiments, the glass composition comprises $Al_2O_3$ in amounts less than or equal to about 20.0 wt %, such as less than or equal to about 19.0 wt %, less than or equal to about 18.0 wt %, less than or equal to about 17.0 wt %, less than or equal to about 16.0 wt %, less than or equal to about 15.0 wt %, less than or equal to about 14.0 wt %, less than or equal to about 13.0 wt %, less than or equal to about 12.0 wt %, less than or equal to about 11.0 wt %, less than or equal to about 10.0 wt %, less than or equal to about 9.0 wt %, less than or equal to about 8.0 wt %, less than or equal to about 7.0 wt %, less than or equal to about 6.0 wt %, less than or equal to about 5.0 wt %, less than or equal to about 4.0 wt %, or less than or equal to about 3.0 wt %. It should be understood that, in embodiments, any of the above ranges may be combined with any other range. In other embodiments, the glass composition comprises $Al_2O_3$ in an amount from greater than or equal to about 2.0 wt % to less than or equal to about 20.0 wt %, such as from greater than or equal to about 3.0 wt % to less than or equal to about 19.0 wt %, from greater than or equal to about 4.0 wt % to less than or equal to about 18.0 wt %, from greater than or equal to about 5.0 wt % to less than or equal to about 17.0 wt %, from greater than or equal to about 6.0 wt % to less than or equal to about 16.0 wt %, from greater than or equal to about 7.0 wt % to less than or equal to about 15.0 wt %, from greater than or equal to about 8.0 wt % to less than or equal to about 14.0 wt %, from greater than or equal to about 9.0 wt % to less than or equal to about 13.0 wt %, from greater than or equal to about 10.0 wt % to less than or equal to about 12.0 wt %, or about 11 wt %, and all ranges and sub-ranges between the foregoing values. In embodiments, the glass composition comprises $Al_2O_3$ in an amount from greater than or equal to about 7.0 wt % to less than or equal to about 11.0 wt %.

The glass ceramics of embodiments may further comprise $B_2O_3$. The inclusion of $B_2O_3$ reduces the melting temperature of the glass composition. Additionally, the existence of $B_2O_3$ in the trigonal coordination state opens up the structure of the glass composition, allowing the glasses to tolerate some degree of deformation before crack formation occurs. In embodiments, the glass composition contains $B_2O_3$ in an amount greater than or equal to 0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In embodiments, the glass composition contains $B_2O_3$ in an amount less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises $B_2O_3$ in an amount from greater than or equal to about 0 wt % to less than or equal to about 5.0 wt %, such as greater than or equal to about 0.5 wt % to less than or equal to about 4.5 wt %, greater than or equal to about 1.0 wt % to less than or equal to about 4.0 wt %, greater than or equal to about 1.5 wt % to less than or equal to about 3.5 wt %, greater than or equal to about 2.0 wt % to less than or equal to about 3.0 wt %, or about 2.5 wt %, and all ranges and sub-ranges between the foregoing values.

The glass ceramics of embodiments further comprise $Li_2O$. The addition of lithium in the glass ceramic allows for an ion exchange process and further reduces the softening point of the precursor glass composition. The $Li_2O$ also provides the lithium necessary for the formation of the lithium silicate crystal phase when the precursor glass is cerammed to form a glass ceramic. If the $Li_2O$ content is too high, the forming of the precursor glass becomes difficult. In embodiments, the glass composition generally comprises $Li_2O$ in an amount greater than 5.0 wt %, such as greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, greater than or equal to about 9.5 wt %, greater than or equal to about 10.0 wt %, greater than or equal to about 10.5 wt %, greater than or equal to about 11.0 wt %, greater than or equal to about 11.5 wt %, greater than or equal to about 12.0 wt %, greater than or equal to about 12.5 wt %, greater than or equal to about 13.0 wt %, greater than or equal to about 13.5 wt %, greater than or equal to about 14.0 wt %, or greater than or equal to about 14.5 wt %. In some embodiments, the glass composition comprises $Li_2O$ in amounts less than or equal to about 15.0 wt %, such as less than or equal to about 14.5 wt %, less than or equal to about 14.0 wt %, less than or equal to about 13.5 wt %, less than or equal to about 13.0 wt %, less than or equal to about 12.5 wt %, less than or equal to about 12.0 wt %, less than or equal to about 11.5 wt %, less than or equal to about 11.0 wt %, less than or equal to about 10.5 wt %, less than or equal to about 10.0 wt %, less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, or less than or equal to about 5.5 wt %. It should be understood that, in embodiments, any of the above ranges may be combined with any other range. In embodiments, the glass composition comprises $Li_2O$ in an amount from greater than 5.0 wt % to less than or equal to about 15.0 wt %, such as from greater than or equal to about 5.5 wt % to less than or equal to about 14.5 wt %, from greater than or equal to about 6.0 wt % to less than or equal to about 14.0 wt %, from greater than or equal to about 6.5 wt % to less than or equal to about 13.5 wt %, from greater than or equal to about 7.0 wt % to less than or equal to about 13.0 wt %, from greater than or equal to about 7.5 wt % to less than or equal to about 12.5 wt %, from greater than or equal to about 8.0 wt % to less than or equal to about 12.0 wt %, from greater than or equal to about 8.5 wt % to less than or equal to about 11.5 wt %, from greater than or equal to about 9.0 wt % to less than or equal to about 11.0 wt %, from greater than or equal to about 9.5 wt % to less than or equal to about 10.5 wt %, or about 10 wt %, and all ranges and sub-ranges between the foregoing values. In some embodiments, the glass composition comprises $Li_2O$ in an amount from greater than or equal to about 6.0 wt % to less than or equal to about 11.0 wt % or from greater than or equal to about 7 wt % to less than or equal to about 15 wt %.

The glass ceramic may include one or more alkali metal oxides in addition to $Li_2O$. The alkali metal oxides further facilitate the chemical strengthening of the glass ceramic, such as through an ion exchange process. The alkali metal oxides (e.g., $Li_2O$, $Na_2O$, and $K_2O$ as well as other alkali metal oxides including $Cs_2O$ and $Rb_2O$) in the glass ceramic may be referred to as "$R_2O$", and the content of $R_2O$ may be expressed in wt %. In some embodiments, the glass ceramic may include a mixture of alkali metal oxides, such as a combination of $Li_2O$ and $Na_2O$, a combination of $Li_2O$ and $K_2O$, or a combination of $Li_2O$, $Na_2O$, and $K_2O$. The inclusion of a mixture of alkali metal oxides in the glass ceramic may result in faster and more efficient ion exchange.

The glass ceramic may include $Na_2O$ as an additional alkali metal oxide. The $Na_2O$ aids in the ion exchangeability of the glass ceramic, and also decreases the melting point of the precursor glass composition and improves formability of the precursor glass composition. The presence of $Na_2O$ also shortens the length of the necessary ceramming treatment. However, if too much $Na_2O$ is added to the glass composition, the CTE may be too high. The $Na_2O$ may also reduce the viscosity of the residual glass in the glass ceramic, which may reduce the cracks formed in the glass ceramics during the ceramming treatment. In embodiments, the glass composition generally comprises $Na_2O$ in an amount greater than or equal to 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In some embodiments, the glass composition comprises $Na_2O$ in amounts less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises $Na_2O$ in an amount from greater than or equal to 0.0 wt % to less than or equal to about 5.0 wt %, such as from greater than or equal to about 0.5 wt % to less than or equal to about 4.5 wt %, from greater than or equal to about 1.0 wt % to less than or equal to 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values.

In embodiments, the glass ceramic may include $P_2O_5$. The $P_2O_5$ acts as a nucleating agent to produce bulk nucleation. If the concentration of $P_2O_5$ is too low, the precursor glass may not crystallize or may undergo undesired surface crystallization. If the concentration of $P_2O_5$ is too high, devitrification of the precursor glass upon cooling during forming may be difficult to control. The presence of $P_2O_5$ in the glass ceramic may also increase the diffusivity of metal ions in the glass ceramic, which may increase the efficiency of ion exchanging the glass ceramic. In embodiments, the amount of $P_2O_5$ in the glass ceramic may be greater than or equal to about 1.0 wt %, such as greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, or greater than or equal to about 5.5 wt %. In embodiments, the amount of $P_2O_5$ in the glass ceramic may be less than or equal to about 6.0 wt %, such as less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, or less than or equal to about 1.5 wt %. It should be understood that, in embodiments, any of the above ranges may be combined with any other range. In embodiments, the glass composition comprises $P_2O_5$ in an amount from greater than or equal to about 1.0 wt % to less than or equal to about 6.0 wt %, such as from greater than or equal to about 1.5 wt % to less than or equal to about 5.5 wt %, from greater than or equal to about 2.0 wt % to less than or equal to about 5.0 wt %, from greater than or equal to about 2.5 wt % to less than or equal to about 4.5 wt %, from greater than or equal to about 3.0 wt % to less than or equal to about 4.0 wt %, or about 4.0 wt %, and all ranges and sub-ranges between the foregoing values.

In embodiments, the glass ceramic may include $ZrO_2$. The $ZrO_2$ acts as a network former or intermediate in the precursor glass compositions. The $ZrO_2$ increases the stability of the glass compositions by reducing the devitrification of the glass composition during forming, and also reduces the liquidus temperature. The addition of $ZrO_2$ also increases the chemical durability of the glass ceramics, and increases the elastic modulus of the residual glass. In embodiments, the amount of $ZrO_2$ in the glass ceramic is greater than or equal to about 2.0 wt %, such as greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, or greater than or equal to about 9.5 wt %. In embodiments, the amount of $ZrO_2$ in the glass ceramic is less than or equal to about 10.0 wt %, such as less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, or less than or equal to about 2.5 wt %. It should be understood that, in embodiments, any of the above ranges may be combined with any other range. In embodiments, the amount of $ZrO_2$ in the glass ceramic is greater than or equal to about 2.0 wt % to less than or equal to about 10.0 wt %, such as greater than or equal to about 2.5 wt % to less than or equal to about 9.5 wt %, greater than or equal to about 3.0 wt % to less than or equal to about 9.0 wt %, greater than or equal to about 3.5 wt % to less than or equal to about 8.5 wt %, greater than or equal to about 4.0 wt % to less than or equal to about 8.0 wt %, greater than or equal to about 4.5 wt % to less than or equal to about 7.5 wt %, greater than or equal to about 5.0 wt % to less than or equal to about 7.0 wt %, greater than or equal to about 5.5 wt % to less than or equal to about 6.5 wt %, or about 6.0 wt %, and all ranges and sub-ranges between the foregoing values. In some embodiments, the amount of $ZrO_2$ in the glass ceramic is greater than or equal to about 2.0 wt % to less than or equal to about 4.0 wt %.

The glass ceramics of embodiments may further comprise ZnO. The ZnO in the precursor glass supplies the zinc necessary to form the gahnite crystal phase when the precursor glass is cerammed to form a glass ceramic. The ZnO also acts as a flux, lowering the cost of the production of the precursor glass. In the glass ceramic, the ZnO may be present in petalite crystals as a solid solution. In embodiments, the glass composition generally comprises ZnO in a concentration of greater than or equal to about 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, greater than or equal to about 7.5 wt %, greater than or equal to about 8.0 wt %, greater than or equal to about 8.5 wt %, greater than or equal to about 9.0 wt %, or greater than or equal to about 9.5 wt %. In embodiments, the glass composition comprises ZnO in amounts less than or equal to about 10.0 wt %, such as less than or equal to about 9.5 wt %, less than or equal to about 9.0 wt %, less than or equal to about 8.5 wt %, less than or equal to about 8.0 wt %, less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass composition comprises ZnO in an amount from greater than or equal to about 0.0 wt % to less than or equal to about 10.0 wt %, such as from greater than or equal to about 0.5 wt % to less than or equal to about 9.5 wt %, from greater than or equal to about 1.0 wt % to less than or equal to about 9.0 wt %, from greater than or equal to about 1.5 wt % to less than or equal to about 8.5 wt %, from greater than or equal to about 2.0 wt % to less than or equal to about 8.0 wt %, from greater than or equal to about 2.5 wt % to less than or equal to about 7.5 wt %, from greater than or equal to about 3.0 wt % to less than or equal to about 7.0 wt %, from greater than or equal to about 3.5 wt % to less than or equal to about 6.5 wt %, from greater than or equal to about 4.0 wt % to less than or equal to about 6.0 wt %, from greater than or equal to about 4.5 wt % to less than or equal to about 5.5 wt %, or about 5.0 wt %, and all ranges and sub-ranges between the foregoing values. In embodiments, the glass ceramic may be substantially free or free of ZnO.

The glass ceramics of embodiments may further comprise MgO. The presence of MgO in the glass may increase the elastic modulus. The MgO also acts as a flux, lowering the cost of the production of the precursor glass. In the glass ceramic, the MgO may be present in petalite crystals as a solid solution. In embodiments, the amount of MgO in the glass ceramic is greater than or equal to about 0.0 wt %, such as greater than or equal to about 0.5 wt %, greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, greater than or equal to about 4.5 wt %, greater than or equal to about 5.0 wt %, greater than or equal to about 5.5 wt %, greater than or equal to about 6.0 wt %, greater than or equal to about 6.5 wt %, greater than or equal to about 7.0 wt %, or greater than or equal to about 7.5 wt %. In embodiments, the amount of MgO in the glass ceramic is less than or equal to about 8.0 wt %, such as less than or equal to about 7.5 wt %, less than or equal to about 7.0 wt %, less than or equal to about 6.5 wt %, less than or equal to about 6.0 wt %, less than or equal to about 5.5 wt %, less than or equal to about 5.0 wt %, less than or equal than about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the amount of MgO in the glass ceramic is greater than or equal to about 0.0 wt % to less than or equal to about 8.0 wt %, such as from greater than or equal to about 0.5 wt % to less than or equal to about 7.5 wt %, from greater than or equal to about 1.0 wt % to less than or equal to about 7.0 wt %, from greater than or equal to about 1.5 wt % to less than or equal to about 6.5 wt %, from greater than or equal to about 2.0 wt % to less than or equal to about 6.0 wt %, from greater than or equal to about 2.5 wt % to less than or equal to about 5.5 wt %, from greater than or equal to about 3.0 wt % to less than or equal to about 5.0 wt %, from greater than or equal to about 3.5 wt % to less than or equal to about 4.5 wt %, or about 4.0 wt %, and all ranges and sub-ranges between the foregoing values.

The glass ceramics of embodiments may further include $TiO_2$. The $TiO_2$ may act as a nucleating agent and in some cases may act as a colorant. In embodiments, the glass may include $TiO_2$ in an amount greater than or equal to about 0.5 wt %, such as greater than or equal to about 1.0 wt %, greater than or equal to about 1.5 wt %, greater than or equal to about 2.0 wt %, greater than or equal to about 2.5 wt %, greater than or equal to about 3.0 wt %, greater than or equal to about 3.5 wt %, greater than or equal to about 4.0 wt %, or greater than or equal to about 4.5 wt %. In embodiments, the glass may include $TiO_2$ in an amount less than or equal to about 5.0 wt %, such as less than or equal to about 4.5 wt %, less than or equal to about 4.0 wt %, less than or equal to about 3.5 wt %, less than or equal to about 3.0 wt %, or less than or equal to about 2.5 wt %. It should be understood that, in embodiments, any of the above ranges may be combined with any other range. In other embodiments, the glass may include $TiO_2$ in an amount from greater than or equal to about 0.5 wt % to less than or equal to about 5.0 wt %, such as an amount from greater than or equal to about 1.0 wt % to less than or equal to about 4.5 wt %, from greater than or equal to about 1.5 wt % to less than or equal to about 4.0 wt %, from greater than or equal to about 2.0 wt % to less than or equal to about 3.5 wt %, or from greater than or equal to about 2.5 wt % to less than or equal to about 3.0 wt %, and all ranges and sub-ranges between the foregoing values.

In embodiments, the glass ceramic may optionally include one or more fining agents. In some embodiments, the fining agents may include, for example, $SnO+SnO_2$ and/or $As_2O_3$. In embodiments, $SnO+SnO_2$ may be present in the glass composition in an amount less than or equal to 0.5 wt %, such as from greater than or equal to 0.05 wt % to less than or equal to 0.5 wt %, greater than or equal to 0.1 wt % to less than or equal to 0.4 wt %, or greater than or equal to 0.2 wt % to less than or equal to 0.3 wt %, and all ranges and sub-ranges between the foregoing values. In embodiments, the glass ceramic may be free or substantially free of one or both of arsenic and antimony.

The glass ceramic includes colorants to produce the desired black color and opacity. The colorants may be selected from $FeO+Fe_2O_3$, NiO, $Co_3O_4$, $TiO_2$, $MnO+MnO_2+Mn_2O_3$, $Cr_2O_3$, CuO, and/or $V_2O_5$. In some embodiments, the glass ceramic includes a mixture of $FeO+Fe_2O_3$, NiO, and $Co_3O_4$, which allows the achievement of the desired color space.

In some embodiments, the glass includes FeO and/or $Fe_2O_3$ such that $FeO+Fe_2O_3$ is included in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes $FeO+Fe_2O_3$ in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include FeO+Fe$_2$O$_3$ in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include FeO+Fe$_2$O$_3$ in an amount from greater than or equal to about 1.0 wt % to less than or equal to about 4.0 wt %.

In some embodiments, the glass includes NiO in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes NiO in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include NiO in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include NiO in an amount from greater than or equal to about 0.5 wt % to less than or equal to about 1.5 wt %.

In some embodiments, the glass includes Co$_3$O$_4$ in an amount greater than or equal to about 0.1 wt %, such as greater than or equal to about 0.5 wt %, greater than or equal to about 1.0 wt %, greater than or equal to about 1.5 wt %, greater than or equal to about 2.0 wt %, greater than or equal to about 3.5 wt %, greater than or equal to about 4.0 wt %, or greater than or equal to about 4.5 wt %. In some embodiments, the glass includes Co$_3$O$_4$ in an amount of less than or equal to about 5.0 wt %, such as less than or equal to about 4.5 wt %, less than or equal to about 4.0 wt %, less than or equal to about 3.5 wt %, less than or equal to about 3.0 wt %, less than or equal to about 2.5 wt %, less than or equal to about 2.0 wt %, less than or equal to about 1.5 wt %, less than or equal to about 1.0 wt %, or less than or equal to about 0.5 wt %. It should be understood that, in embodiments, any of the above ranges may be combined with any other range. In embodiments, the glass may include Co$_3$O$_4$ in an amount from greater than or equal to about 0.1 wt % to less than or equal to about 5.0 wt %, such as an amount from greater than or equal to about 0.5 wt % to less than or equal to about 4.5 wt %, from greater than or equal to about 1.0 wt % to less than or equal to about 4.0 wt %, from greater than or equal to about 1.5 wt % to less than or equal to about 3.5 wt %, from greater than or equal to about 2.0 wt % to less than or equal to about 3.0 wt %, or about 2.5 wt %, and all ranges and sub-ranges between the foregoing values. In embodiments, the glass may include Co$_3$O$_4$ in an amount from greater than or equal to about 0.1 wt % to less than or equal to about 0.4 wt %.

In embodiments, the glass ceramic may include MnO, MnO$_2$, and/or Mn$_2$O$_3$ such that MnO+MnO$_2$+Mn$_2$O$_3$ may be included in the glass ceramic in an amount from greater than or equal to 0 wt % to less than or equal to about 4.0 wt %, such as greater than or equal to about 0.5 wt % to less than or equal to about 3.5 wt %, greater than or equal to about 1.0 wt % to less than or equal to about 3.0 wt %, greater than or equal to about 1.5 wt % to less than or equal to about 2.5 wt %, or about 2.0 wt %, and all ranges and sub-ranges between the foregoing values. In embodiments, Cr$_2$O$_3$ may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values. In embodiments, CuO may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values. In embodiments, V$_2$O$_5$ may be included in the glass ceramic in an amount from greater than or equal to 0 wt % to less than or equal to about 2.0 wt %, such as greater than or equal to about 0.5 wt % to less than or equal to about 1.5 wt %, or about 1.0 wt %, and all ranges and sub-ranges between the foregoing values.

From the above, glass ceramics according to embodiments may be formed from precursor glass articles formed by any suitable method, such as slot forming, float forming, rolling processes, fusion forming processes, etc. A precursor glass article may be characterized by the manner in which it is formed. For instance, where the precursor glass article may be characterized as float-formable (i.e., formed by a float process), down-drawable and, in particular, fusion-formable or slot-drawable (i.e., formed by a down draw process such as a fusion draw process or a slot draw process).

Some embodiments of the precursor glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the precursor glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

The glass ceramics may be formed by ceramming a precursor glass under any suitable conditions. The ceramming cycle includes a nucleation step and a growth step. In some embodiments, the ceramming cycle may include three separate heat treatment steps at three separate temperatures.

In embodiments, the nucleation step and the growth step (or ceramming step) occur at temperatures of greater than or equal to about 500° C., such as greater than or equal to about 525° C., greater than or equal to about 550° C., greater than or equal to about 575° C., greater than or equal to about 600° C., greater than or equal to about 625° C., greater than or equal to about 650° C., greater than or equal to about 675° C., greater than or equal to about 700° C., greater than or equal to about 725° C., greater than or equal to about 750° C., greater than or equal to about 775° C., greater than or equal to about 800° C., greater than or equal to about 825° C., greater than or equal to about 850° C., or greater than or equal to about 875° C. In embodiments, the nucleation step and the growth step occurs at temperatures of from greater than or equal to about 500° C. to less than or equal to about 900° C., such as greater than or equal to about 525° C. to less than or equal to about 875° C., greater than or equal to about 550° C. to less than or equal to about 850° C., greater than or equal to about 575° C. to less than or equal to about 825° C., greater than or equal to about 600° C. to less than or equal to about 800° C., greater than or equal to about 625° C. to less than or equal to about 775° C., greater than or equal to about 650° C. to less than or equal to about 750° C., greater than or equal to about 675° C. to less than or equal to about 725° C., or about 700° C., and all ranges and sub-ranges between the foregoing values.

In embodiments, the individual steps of the ceramming cycle extend for a time period greater than or equal to about 1.0 hour, such as greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, greater than or equal to about 4.5 hours, greater than or equal to about 5.0 hours, greater than or equal to about 5.5 hours, or greater than or equal to about 6.0 hours, greater than or equal to about 6.5 hours, greater than or equal to about 7.0 hours, greater than or equal to about 7.5 hours, or greater than or equal to about 8.0 hours. In embodiments, the individual steps of the ceramming cycle extend for a time period from greater than or equal to about 1.0 hour to less than or equal to about 8.0 hours, such as greater than or equal to about 1.5 hours to less than or equal to about 7.5 hours, greater than or equal to about 2.0 hours to less than or equal to about 7.0 hours, greater than or equal to about 1.5 hours to less than or equal to about 6.5 hours, greater than or equal to about 2.0 hours to less than or equal to about 6.0 hours, greater than or equal to about 2.5 hours to less than or equal to about 5.5 hours, greater than or equal to about 3.0 hours to less than or equal to about 5.0 hours, greater than or equal to about 3.5 hours to less than or equal to about 4.5 hours, or about 4.0 hours, and all ranges and sub-ranges between the foregoing values.

In embodiments, the ceramming cycle extends for a total time period greater than or equal to about 1.0 hour, such as greater than or equal to about 1.5 hours, greater than or equal to about 2.0 hours, greater than or equal to about 2.5 hours, greater than or equal to about 3.0 hours, greater than or equal to about 3.5 hours, greater than or equal to about 4.0 hours, greater than or equal to about 4.5 hours, greater than or equal to about 5.0 hours, greater than or equal to about 5.5 hours, or greater than or equal to about 6.0 hours, greater than or equal to about 6.5 hours, greater than or equal to about 7.0 hours, greater than or equal to about 7.5 hours, greater than or equal to about 8.0 hours, greater than or equal to about 8.5 hours, greater than or equal to about 9.0 hours, greater than or equal to about 9.5 hours, greater than or equal to about 10.0 hours, greater than or equal to about 10.5 hours, greater than or equal to about 11.0 hours greater than or equal to about 11.5 hours, greater than or equal to about 12.0 hours, greater than or equal to about 12.5 hours, greater than or equal to about 13.0 hours, greater than or equal to about 13.5 hours, greater than or equal to about 14.0 hours, greater than or equal to about 14.5 hours, greater than or equal to about 15.0 hours, or greater than or equal to about 15.5 hours. In embodiments, the ceramming cycle extends for a total time period from greater than or equal to about 6 hours to less than or equal to about 16.0 hours, such as greater than or equal to about 6.5 hours to less than or equal to about 15.5 hours, greater than or equal to about 7.0 hours to less than or equal to about 15.0 hours, greater than or equal to about 7.5 hours to less than or equal to about 14.5 hours, greater than or equal to about 8.0 hours to less than or equal to about 14.0 hours, greater than or equal to about 8.5 hours to less than or equal to about 13.5 hours, greater than or equal to about 9.0 hours to less than or equal to about 13.0 hours, greater than or equal to about 9.5 hours to less than or equal to about 12.5 hours, greater than or equal to about 10.0 hours to less than or equal to about 12.0 hours, greater than or equal to about 10.5 hours to less than or equal to about 11.5 hours, or about 11.0 hours, and all ranges and sub-ranges between the foregoing values.

In embodiments, the precursor glass articles and/or nucleated articles may be machined to form a substantially final geometry part prior to being cerammed. The machining may include the formation of slots, holes, and regions with varying thickness. In embodiments, the glass may have an engineered edge profile and/or a three-dimensional shape.

In embodiments, the glass ceramics are also chemically strengthened, such as by ion exchange, producing a glass ceramic that is damage resistant for applications such as, but not limited to electronic device housings. With reference to FIG. 1, the glass ceramic has a first region under compressive stress (e.g., first and second compressive layers 120, 122 in FIG. 1) extending from the surface to a depth of compression (DOC) of the glass ceramic and a second region (e.g., central region 130 in FIG. 1) under a tensile stress or central tension (CT) extending from the DOC into the central or interior region of the glass ceramic. As used herein, DOC refers to the depth at which the stress within the glass ceramic changes from compressive to tensile. At the DOC, the stress crosses from a positive (compressive) stress to a negative (tensile) stress and thus exhibits a stress value of zero.

According to the convention normally used in the art, compression or compressive stress is expressed as a negative (<0) stress and tension or tensile stress is expressed as a positive (>0) stress. Throughout this description, however, CS is expressed as a positive or absolute value—i.e., as recited herein, CS=|CS|. The compressive stress (CS) may have a maximum at the surface of the glass, and the CS may vary with distance d from the surface according to a function. Referring again to FIG. 1, a first compressive layer 120 extends from first surface 110 to a depth $d_1$ and a second compressive layer 122 extends from second surface 112 to a depth dz. Together, these segments define a compression or CS of glass ceramic 100.

The compressive stress of both compressive stress regions (120, 122 in FIG. 1) is balanced by stored tension in the central region (130) of the glass ceramic. The DOC values may be approximated based on the concentration profile of the ions exchanged into the glass ceramic articles during the ion exchange treatment, such as the depth below the surface of the glass ceramic article where the measured concentration becomes substantially equal to the concentration in the glass ceramic article prior to the ion exchange treatment.

Compressive stress layers may be formed in the glass ceramic by exposing the glass to an ion exchange solution. In embodiments, the ion exchange solution may contain molten nitrate salt. In some embodiments, the ion exchange solution may be molten $KNO_3$, molten $NaNO_3$, molten $LiNO_3$, or combinations thereof. In embodiments, the ion exchange solution may comprise less than or equal to about 100% molten $KNO_3$, such as less than or equal to about 95% molten $KNO_3$, less than or equal to about 90% molten $KNO_3$, less than or equal to about 85% molten $KNO_3$, less than or equal to about 80% molten $KNO_3$, less than or equal to about 75% molten $KNO_3$, less than or equal to about 70% molten $KNO_3$, less than or equal to about 65% molten $KNO_3$, less than or equal to about 60% molten $KNO_3$, or less. In certain embodiments, the ion exchange solution may comprise greater than or equal to about 20% molten $NaNO_3$, such as greater than or equal to about 25% molten $NaNO_3$, greater than or equal to about 30% molten $NaNO_3$, greater than or equal to about 35% molten $NaNO_3$, greater than or equal to about 40% molten $NaNO_3$, or more. In embodiments, the ion exchange solution may comprise about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In embodiments, the ion exchange solution may a molten salt bath including a mixture of $KNO_3$, $NaNO_3$, and $LiNO_3$. In embodiments, other sodium and potassium salts may be used in the ion exchange solution, such as, for example sodium or potassium nitrites, phosphates, or sulfates. In embodiments, the ion exchange solution may contain silicic acid, such as less than or equal to about 1 wt % silicic acid.

The glass ceramic may be exposed to the ion exchange solution by dipping the glass ceramic into a bath of the ion exchange solution, spraying the ion exchange solution onto the glass ceramic, or otherwise physically applying the ion exchange solution to the glass ceramic. Upon exposure to the glass ceramic, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values. In embodiments, the glass ceramic may be exposed to the ion exchange solution for a duration from greater than or equal to 4 hours to less than or equal to 48 hours, such as from greater than or equal to 8 hours to less than or equal to 44 hours, from greater than or equal to 12 hours to less than or equal to 40 hours, from greater than or equal to 16 hours to less than or equal to 36 hours, from greater than or equal to 20 hours to less than or equal to 32 hours, or from greater than or equal to 24 hours to less than or equal to 28 hours, and all ranges and sub-ranges between the foregoing values.

The ion exchange process may be performed in an ion exchange solution under processing conditions that provide an improved compressive stress profile as disclosed, for example, in U.S. Patent Application Publication No. 2016/0102011, which is incorporated herein by reference in its entirety.

After an ion exchange process is performed, it should be understood that a composition at the surface of the glass ceramic may be different than the composition of the as-formed glass ceramic (i.e., the glass ceramic before it undergoes an ion exchange process). This results from one type of alkali metal ion in the glass phase of the as-formed glass ceramic, such as, for example $Li^+$ or $Na^+$, being replaced with larger alkali metal ions, such as, for example $Na^+$ or $K^+$, respectively. However, the composition of the glass ceramic at or near the center of the depth of the glass article will, in embodiments, be the least influenced by the ion exchange treatment and may have a composition substantially the same as or the same as the as-formed glass ceramic.

In embodiments, the ion exchanged glass ceramic articles may have a surface compressive stress of greater than or equal to about 250 MPa, such as greater than or equal to about 260 MPa, greater than or equal to about 270 MPa, greater than or equal to about 280 MPa, greater than or equal to about 290 MPa, greater than or equal to about 300 MPa, greater than or equal to about 310 MPa, greater than or equal to about 320 MPa, greater than or equal to about 330 MPa, greater than or equal to about 340 MPa, greater than or equal to about 350 MPa, greater than or equal to about 360 MPa, greater than or equal to about 370 MPa, greater than or equal to about 380 MPa, greater than or equal to about 390 MPa, greater than or equal to about 400 MPa, greater than or equal to about 410 MPa, greater than or equal to about 420 MPa, greater than or equal to about 430 MPa, greater than or equal to about 440 MPa, greater than or equal to about 450 MPa, greater than or equal to about 460 MPa, greater than or equal to about 470 MPa, greater than or equal to about 480 MPa, greater than or equal to about 490 MPa, greater than or equal to about 500 MPa, greater than or equal to about 510 MPa, greater than or equal to about 520 MPa, greater than or equal to about 530 MPa, greater than or equal to about 540 MPa, greater than or equal to about 550 MPa, greater than or equal to about 560 MPa, greater than or equal to about 570 MPa, greater than or equal to about 580 MPa, greater than or equal to about 590 MPa, greater than or equal to about 600 MPa, greater than or equal to about 610 MPa, greater than or equal to about 620 MPa, greater than or equal to about 630 MPa, or greater than or equal to about 640 MPa. In embodiments, the ion exchanged glass ceramic articles may have a surface compressive stress from greater than or equal to about 250 MPa to less than or equal to about 650 MPa, such as greater than or equal to about 260 MPa to less than or equal to about 640 MPa, greater than or equal to about 270 MPa to less than or equal to about 630 MPa, greater than or equal to about 280 MPa to less than or equal to about 620 MPa, greater than or equal to about 290 MPa to less than or equal to about 610 MPa, greater than or equal to about 300 MPa to less than or equal to about 600 MPa, greater than or equal to about 310 MPa to less than or equal to about 590 MPa, greater than or equal to about 320 MPa to less than or equal to about 580 MPa, greater than or equal to about 330 MPa to less than or equal to about 570 MPa, greater than or equal to about 340 MPa to less than or equal to about 560 MPa, greater than or equal to about 350 MPa to less than or equal to about 550 MPa, greater than or equal to about 360 MPa to less than or equal to about 540 MPa, greater than or equal to about 370 MPa to less than or equal to about 530 MPa, greater than or equal to about 380 MPa to less than or equal to about 520 MPa, greater than or equal to about 390 MPa to less than or equal to about 510 MPa, greater than or equal to about 400 MPa to less than or equal to about 500 MPa, greater than or equal to about 410 MPa to less than or equal to about 490 MPa, greater than or equal to about 420 MPa to less than or equal to about 480 MPa, greater than or equal to about 430 MPa to less than or equal to about 470 MPa, greater than or equal to about 440 MPa to less than or equal to about 460 MPa, or about 450 MPa, and all ranges and sub-ranges between the foregoing values.

In embodiments, the ion exchanged glass ceramic articles may have a depth of the compressive stress layer (depth of compression) of greater than or equal to about 400 µm, such as greater than or equal to about 410 µm, greater than or equal to about 420 µm, greater than or equal to about 430 µm, greater than or equal to about 440 µm, greater than or equal to about 450 µm, greater than or equal to about 460 µm, greater than or equal to about 470 µm, greater than or equal to about 480 µm, greater than or equal to about 490 µm, greater than or equal to about 500 µm, or more. In embodiments, the ion exchanged glass ceramic articles may have a depth of compression of greater than or equal to about 40 µm, such as greater than or equal to about 50 µm, greater than or equal to about 60 µm, greater than or equal to about 70 µm, greater than or equal to about 80 µm, greater than or equal to about 90 µm, greater than or equal to about 100 µm, or more. In embodiments, the depth of compression may be from greater than or equal to about 40 µm to less than or equal to 500 µm, such as from greater than or equal to about 50 µm to less than or equal to about 480 µm, from greater than or equal to about 60 µm to less than or equal to about 460 µm, from greater than or equal to about 70 µm to less than or equal to about 440 µm, from greater than or equal to about 80 µm to less than or equal to about 420 µm, from greater than or equal to about 90 µm to less than or equal to about 400 µm, from greater than or equal to about 100 µm to less than or equal to about 380 µm, from greater than or equal to about 120 µm to less than or equal to about 360 µm, from greater than or equal to about 140 µm to less than or equal to about 340 µm, from greater than or equal to about 160 µm to less than or equal to about 320 µm, from greater than or equal to about 180 µm to less than or equal to about 300 µm, from greater than or equal to about 200 µm to less than or equal to about 280 µm, from greater than or equal to about 220 µm to less than or equal to about 260 µm, about 240 µm, and any and all sub-ranges formed from these endpoints.

In embodiments, the ion exchanged glass ceramic articles may have a depth of the compressive stress layer (depth of compression) of greater than or equal to about 0.05t where t is the thickness of the glass ceramic article, such as greater than or equal to about 0.1t, greater than or equal to about 0.15t, greater than or equal to about 0.2t, or more. In embodiments, the glass ceramic articles may have a depth of compression from greater than or equal to about 0.05t to less than or equal to 0.25t where t is the thickness of the glass ceramic article, such as from greater than or equal to about 0.1t to less than or equal to 0.2t, or about 0.05t, and any and all sub-ranges formed from these endpoints.

In embodiments, the ion exchanged glass ceramic may have a high strength. In some embodiments, the ion exchanged glass ceramic has a strength of greater than or equal to about 900 MPa, such as greater than or equal to about 910 MPa, greater than or equal to about 920 MPa, greater than or equal to about 930 MPa, greater than or equal to about 940 MPa, greater than or equal to about 950 MPa, greater than or equal to about 960 MPa, greater than or equal to about 970 MPa, greater than or equal to about 980 MPa, greater than or equal to about 990 MPa, greater than or equal to about 1000 MPa, or more. The strength refers to the strength as measured by the ring-on-ring test described below. In embodiments, the ion exchanged glass ceramic has a strength from greater than or equal to about 900 MPa to less than or equal to about 1000 MPa, such as greater than or equal to about 910 MPa to less than or equal to about 990 MPa, greater than or equal to about 920 MPa to less than or equal to about 980 MPa, greater than or equal to about 930 MPa to less than or equal to about 970 MPa, greater than or equal to about 940 MPa to less than or equal to about 960 MPa, or about 950 MPa, and any and all sub-ranges formed from these endpoints. In embodiments, the ion exchanged glass ceramic has a strength of greater than or equal to about 700 MPa.

The glass ceramic articles may have any appropriate geometry. In embodiments, the glass ceramic articles may have a thickness of greater than or equal to about 0.4 mm, such as greater than or equal to about 0.5 mm, greater than or equal to about 0.6 mm, greater than or equal to about 0.7 mm, greater than or equal to about 0.8 mm, greater than or equal to about 0.9 mm, greater than or equal to about 1.0 mm, greater than or equal to about 1.5 mm, greater than or equal to about 2.0 mm, or more. In embodiments, the glass ceramic articles may have a thickness from greater than or equal to about 0.4 mm to less than or equal to about 2.0 mm, such as from greater than or equal to about 0.5 mm to less than or equal to about 1.5 mm, from greater than or equal to about 0.6 mm to less than or equal to about 1.0 mm, from greater than or equal to about 0.7 mm to less than or equal to about 0.9 mm, about 0.8 mm, and any and all sub-ranges formed from these endpoints. In embodiments, the glass ceramic articles have a thickness in the range from greater than or equal to about 0.8 mm to less than or equal to about 1.0 mm.

Figure 2A:
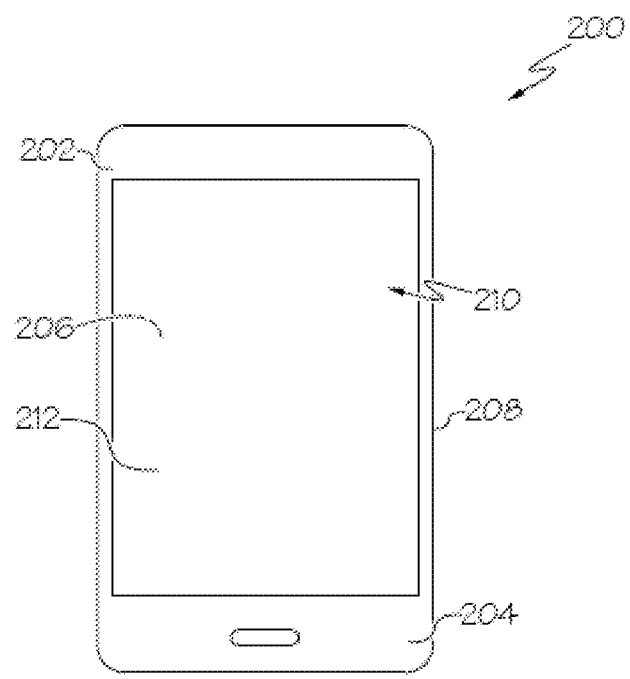
FIG. 2A is a plan view of an exemplary electronic device incorporating any of the glass ceramics disclosed herein.
Figure 2B:
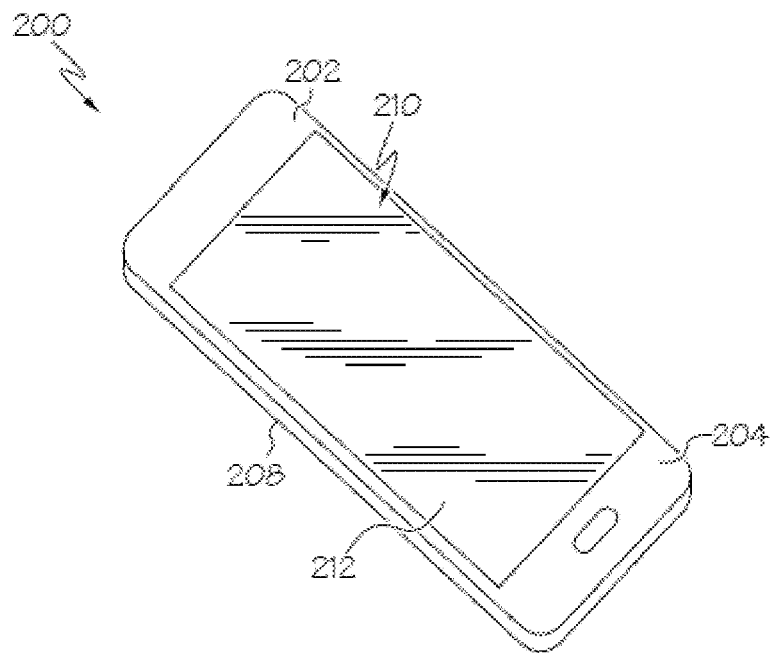
FIG. 2B is a perspective view of the exemplary electronic device of FIG. 2A.

The glass ceramic articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some scratch-resistance, abrasion resistance or a combination thereof. An exemplary article incorporating any of the glass ceramic articles disclosed herein is shown in FIGS. 2A and 2B. Specifically, FIGS. 2A and 2B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover substrate 212 at or over the front surface of the housing such that it is over the display. In some embodiments, at least a portion of the housing 202 may include any of the glass ceramic articles disclosed herein.

EXAMPLES

Embodiments will be further clarified by the following examples. It should be understood that these examples are not limiting to the embodiments described above.

Glass ceramics having components, in wt %, listed in Table 1 below were prepared and ceramed according to the indicated ceramming cycles. The ceramming cycles included a ramp rate of 5° C/minute from room temperature to the nucleation temperature. In Table 1, the individual steps of the ceramming cycle are listed as a temperature and hold time in separate lines of the ceramming cycle entry, with three distinct ceramming cycle steps in each of the examples.

TABLE 1

|  | 1 | 2 | 3 | 4 | 5 | 6 |
|---|---|---|---|---|---|---|
| $SiO_2$ | 69.2 | 68.8 | 68.5 | 69.0 | 69.4 | 70.7 |
| $Al_2O_3$ | 8.2 | 8.2 | 8.1 | 8.2 | 8.2 | 8.4 |
| $B_2O_3$ | 0.0 | 0.0 | 0.0 | 0.5 | 0.5 | 0.5 |
| $Li_2O$ | 9.5 | 9.4 | 9.4 | 9.4 | 9.5 | 9.7 |
| $Na_2O$ | 0.9 | 1.5 | 1.9 | 1.5 | 0.9 | 0.9 |
| $ZrO_2$ | 3.5 | 3.5 | 3.5 | 3.5 | 3.5 | 1.8 |
| $P_2O_5$ | 2.3 | 2.3 | 2.3 | 2.3 | 2.3 | 2.3 |
| $TiO_2$ | 2.7 | 2.6 | 2.6 | 2.6 | 2.7 | 2.7 |
| $Fe_2O_3$ | 2.7 | 2.6 | 2.6 | 1.8 | 1.8 | 1.8 |
| NiO | 0.9 | 0.9 | 0.9 | 0.9 | 0.9 | 0.9 |
| $Co_3O_4$ | 0.2 | 0.2 | 0.2 | 0.2 | 0.2 | 0.2 |
| $MnO_2$ | 0.0 | 0.0 | 0.0 | 0.0 | 0.0 | 0.0 |
| Ceramming cycle | 600° C./4 hr 650° C./4 hr 700° C./4 hr | 600° C./4 hr 650° C./4 hr 700° C./4 hr | 600° C./4 hr 650° C./4 hr 710° C./4 hr | 540° C./4 hr 600° C./4 hr 700° C./2 hr | 540° C./4 hr 600° C./4 hr 700° C./2 hr | 600° C./4 hr 650° C./4 hr 700° C./2 hr |
| Phase assemblage | β-quartz, petalite, cristobalite, lithium metasilicate | Petalite, β-quartz, lithium disilicate, cristobalite, lithium metasilicate | Petalite, lithium disilicate, β-quartz | Petalite, β-quartz, cristobalite, lithium metasilicate | β-quartz, petalite, cristobalite, lithium metasilicate | β-quartz, lithium disilicate, β-spodumene |
| Appearance | Black | Black | Black | Black | Black | Black |
| Color coordinates | L* = 24.86 a* = 0.17 b* = −0.05 | L* = 25.26 a* = 0.03 b* = −0.69 | L* = 27.23 a* = −0.07 b* = −1.15 | | | |
| $K_{ic}$ ($MPa \cdot m^{0.5}$) | | | 1.15 | 0.97 | 0.94 | 0.95 |
| RoR (MPa) | | | 291 | | | |
| RoR (MPa) post IOX | | | 952 | | | |
| 24 hour Liquidus temp air (° C.) | 1085 | 1065 | 1025 | 1050 | 1065 | 1090 |
| Liquidus viscosity (poise) | | 2980 | 4870 | 3280 | 3500 | 2371 |
| Liquidus phase | β-spodumene | β-spodumene | β-spodumene | β-spodumene | β-spodumene | β-spodumene |

|  | 7 | 8 | 9 | 10 | 11 | 12 |
|---|---|---|---|---|---|---|
| $SiO_2$ | 69.0 | 70.3 | 67.9 | 67.3 | 68.5 | 68.5 |
| $Al_2O_3$ | 8.9 | 9.1 | 8.1 | 8.0 | 8.7 | 9.6 |
| $B_2O_3$ | 0.2 | 0.2 | 0.0 | 0.0 | 0.0 | 0.0 |
| $Li_2O$ | 10.5 | 10.7 | 9.3 | 9.2 | 8.7 | 7.9 |
| $Na_2O$ | 0.4 | 0.4 | 1.9 | 1.9 | 1.9 | 1.9 |
| $ZrO_2$ | 1.8 | 1.8 | 3.5 | 3.4 | 3.5 | 3.5 |
| $P_2O_5$ | 1.9 | 2.0 | 2.3 | 2.2 | 2.3 | 2.3 |
| $TiO_2$ | 2.6 | 2.7 | 3.0 | 3.4 | 2.6 | 2.6 |
| $Fe_2O_3$ | 2.6 | 1.8 | 3.0 | 3.4 | 2.6 | 2.6 |
| NiO | 0.9 | 0.9 | 0.9 | 0.9 | 0.9 | 0.9 |
| $Co_3O_4$ | 0.2 | 0.2 | 0.2 | 0.2 | 0.2 | 0.2 |
| $MnO_2$ | 0.9 | 0.0 | 0.0 | 0.0 | 0.0 | 0.0 |
| Ceramming cycle | 600° C./4 hr 650° C./4 hr 700° C./2 hr | 600° C./4 hr 650° C./4 hr 700° C./2 hr | 600° C./4 hr 650° C./4 hr 710° C./4 hr | 600° C./4 hr 650° C./4 hr 710° C./4 hr | 600° C./4 hr 650° C./4 hr 710° C./4 hr | 600° C./4 hr 650° C./4 hr 710° C./4 hr |
| Phase assemblage | β-quartz, lithium disilicate, petalite, lithium metasilicate | β-quartz, lithium disilicate, petalite, lithium metasilicate | petalite, lithium disilicate, β-quartz, β-spodumene | β-quartz, petalite, lithium metasilicate, cristobalite | β-quartz, petalite, lithium metasilicate, lithium disilicate, β-spodumene | β-quartz, lithium metasilicate, β-spodumene, cristobalite |
| Appearance | Black | Black | Black | Black | Black | Black |
| Color coordinates | | | L* = 26.93 a* = −0.08 b* = −1.55 | L* = 26.90 a* = −0.04 b* = −1.48 | L* = 27.11 a* = −0.04 b* = −0.92 | L* = 28.49 a* = −0.24 b* = −1.54 |
| $K_{ic}$ ($MPa \cdot m^{0.5}$) | | 1.06 | | | | |
| RoR (MPa) | | | | | | |
| RoR (MPa) post IOX | | | | | | |

TABLE 1-continued

| | | | | | |
|---|---|---|---|---|---|
| 24 hour Liquidus temp air (° C.) | 1090 | 1045 | 1060 | 1070 | 1175 |
| Liquidus viscosity (poise) | 1057 | 3444 | 2345 | 3721 | 1750 |
| Liquidus phase | β-spodumene | β-spodumene | β-spodumene | β-spodumene | Zircon |

The phase assemblage of the glass ceramics was determined using X-ray diffraction (XRD) analysis of the cerammed samples. The appearance of the glass ceramics is an impression based on observation of the samples. The color coordinates were measured using an X-rite Ci7 F02 illuminant under SCI UVC conditions. The liquidus temperature was measured in accordance with ASTM C829-81 (2015), titled "Standard Practice for Measurement of Liquidus Temperature of Glass by the Gradient Furnace Method" for the precursor glass. The viscosity of the glass at the liquidus temperature is measured in accordance with ASTM C965-96(2012), titled "Standard Practice for Measuring Viscosity of Glass Above the Softening Point" to determine the liquidus viscosity. The fracture toughness value (Kic) was measured by the chevron notched short bar (CNSB) method disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that $Y^*_m$ is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). The Ring-on-Ring (RoR) strength was measured as described in further detail below.

Comparative Examples 1 and 2 were produced with the compositions and ceramming cycles described in Table 2 below.

TABLE 2

| | Comp. Ex. 1 | Comp. Ex. 2 |
|---|---|---|
| $SiO_2$ | 64.1 | 57.2 |
| $Al_2O_3$ | 21.2 | 21.1 |
| $B_2O_3$ | 0.0 | 5.3 |
| $Li_2O$ | 3.6 | 0.0 |
| $Na_2O$ | 0.4 | 12.7 |
| MgO | 1.7 | 1.1 |
| ZnO | 1.3 | 0.0 |
| $TiO_2$ | 4.8 | 1.2 |
| $SnO_2$ | 0.4 | 0.1 |
| $Fe_2O_3$ | 2.6 | 1.3 |
| $Co_3O_4$ | 0.0 | 0.0 |
| Ceramming cycle | 780° C./2 hr 1000° C./4 hr | 630° C./2 hr 700° C./4 hr |

Figure 3:
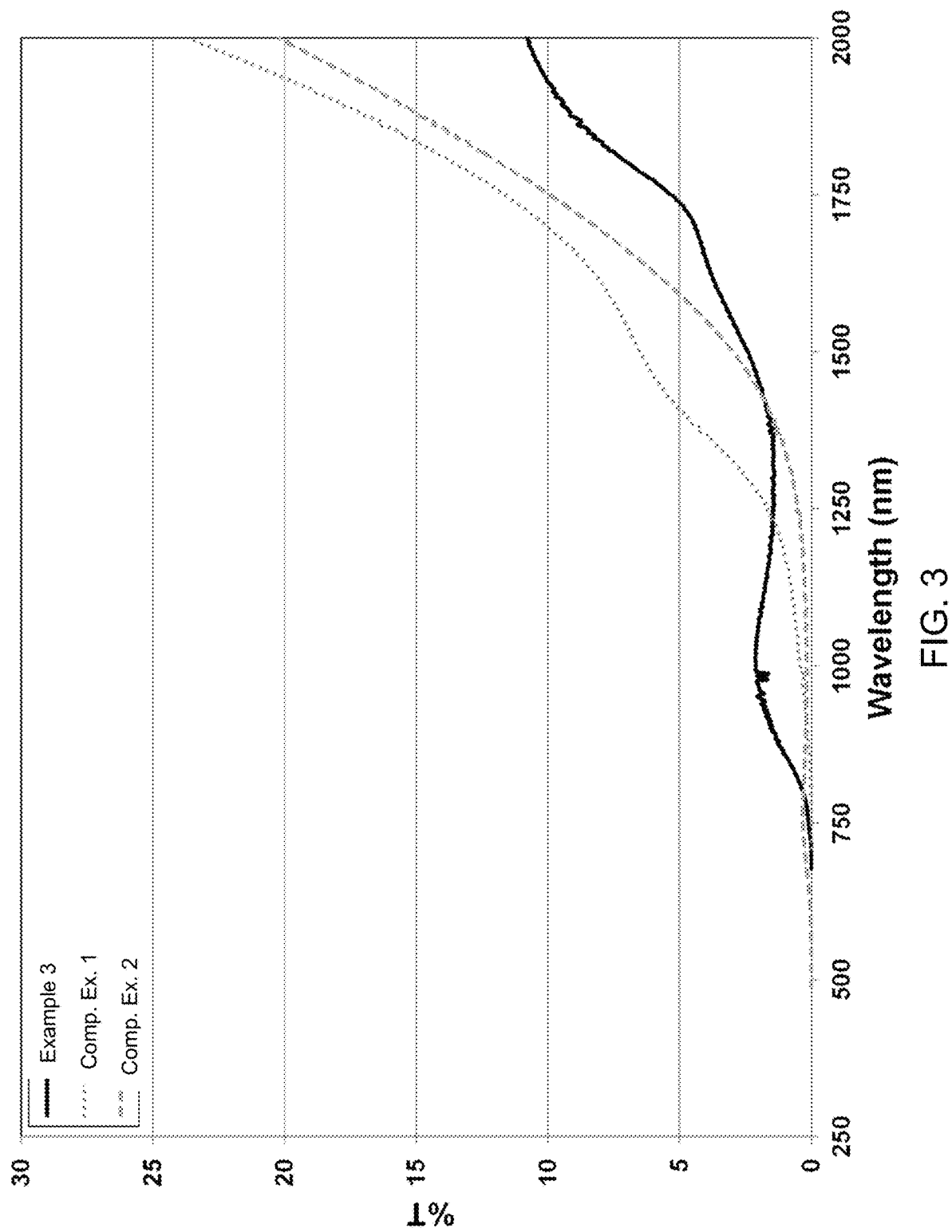
FIG. 3 is a transmittance spectrum of a glass ceramic having a thickness of 0.8 mm according to embodiments and two glass ceramics having a thickness of 0.8 mm according to comparative examples.

The transmittance of Examples 3 of Table 1 and Comparative Examples 1 and 2 of Table 2 was measured for 0.8 mm thick samples, as described above. As shown in FIG. 3, the glass ceramic of Example 3 has a transmittance of less than 1% in the visible wavelength range.

Figure 4:
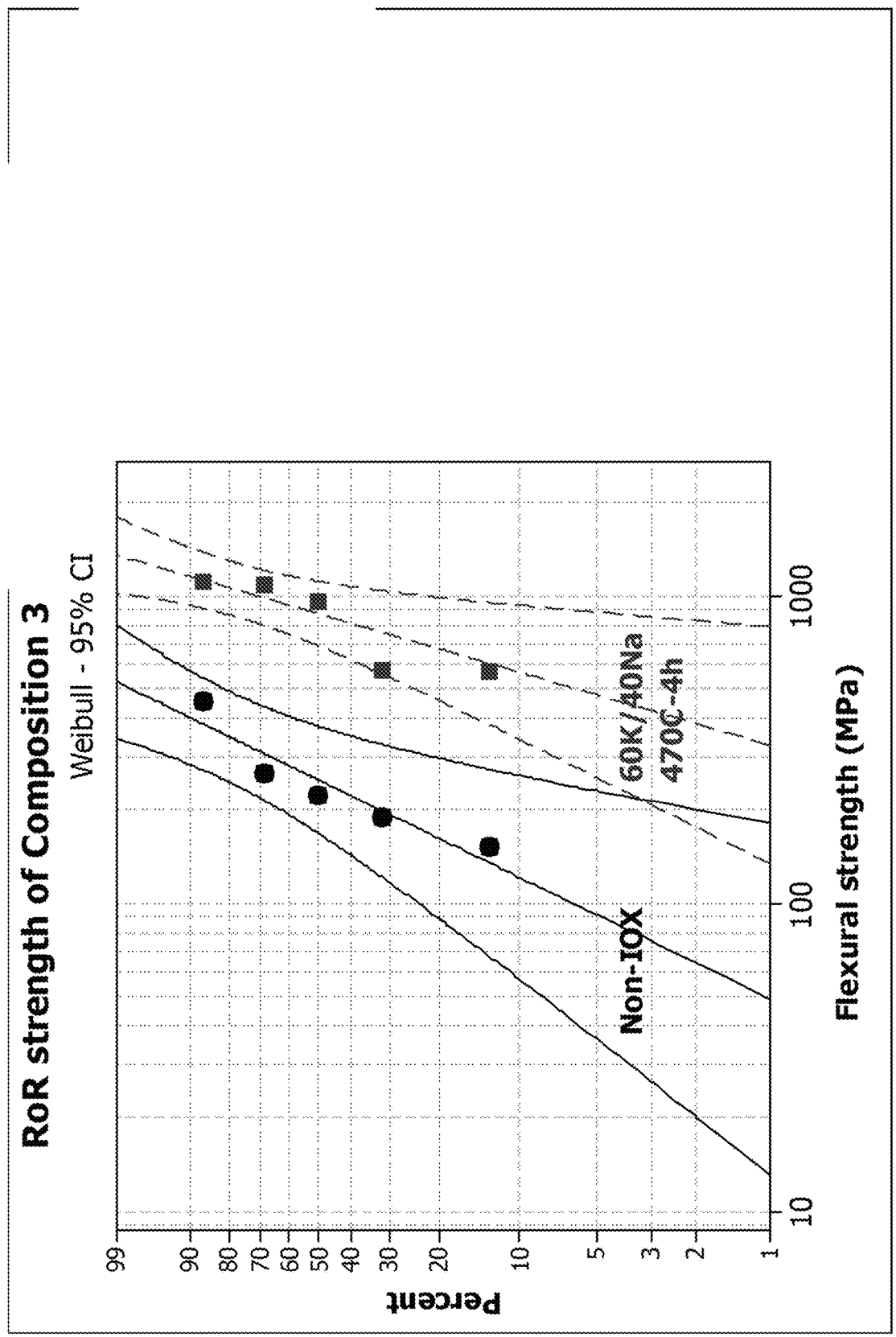
FIG. 4 is a Weibull plot of the results of a Ring-on-Ring (RoR) strength test for a glass ceramic according to an embodiment before and after an ion exchange treatment.

A sample of Example 3 with a thickness of 1.0 mm was ion exchanged in a 60 wt % $KNO_3$ and 40 wt % $NaNO_3$ bath at a temperature of 470° C. for a time period of 4 hours. The ring-on-ring strength of the sample was measured before and after the ion exchange treatment, as described below. The Weibull plot of the results of the ring-on-ring test is shown in FIG. 4.

The Ring-on-Ring (RoR) test is a surface strength measurement for testing flat glass specimens, and ASTM C1499-09(2013), entitled "Standard Test Method for Monotonic Equibiaxial Flexural Strength of Advanced Ceramics at Ambient Temperature," serves as the basis for the RoR test methodology described herein. The contents of ASTM C1499-09 are incorporated herein by reference in their entirety. The specimen was not abraded prior to ring-on-ring testing.

Figure 6:
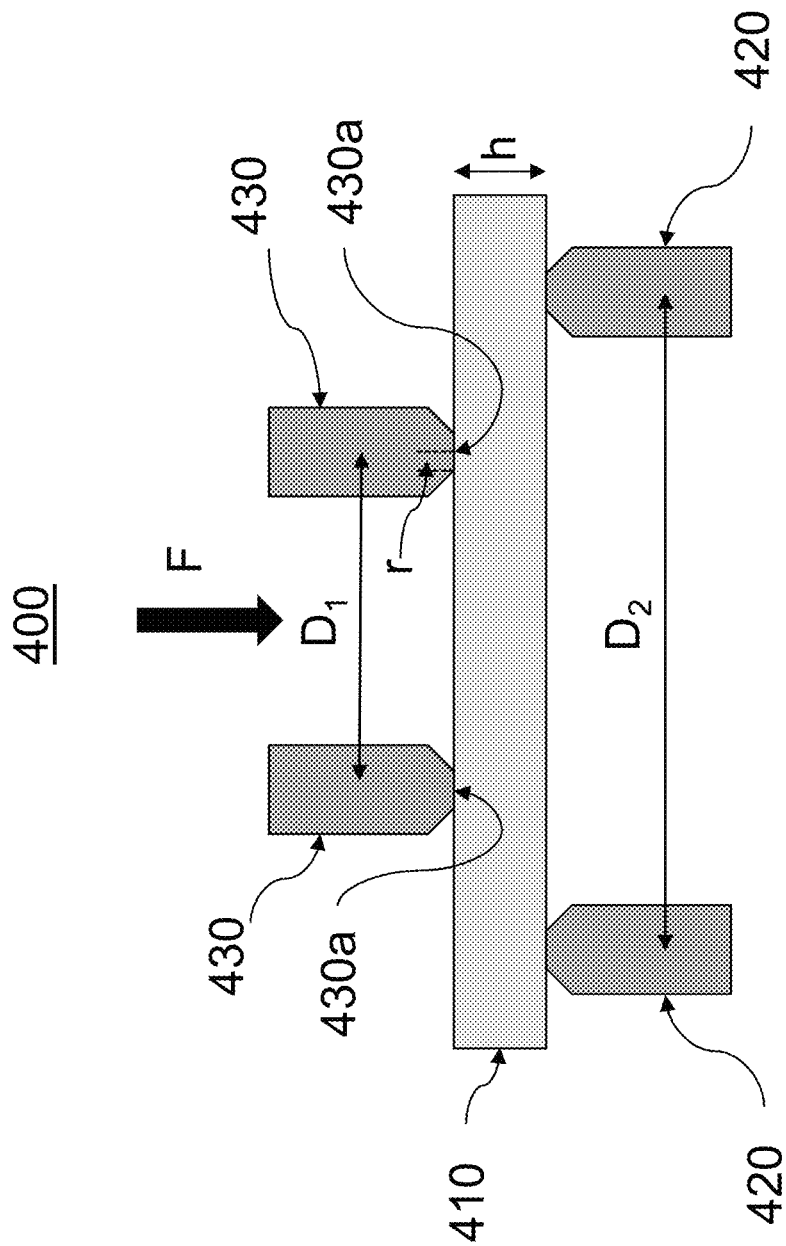
FIG. 6 is a schematic depiction of a ring-on-ring testing apparatus.

For the RoR test, a sample as shown in FIG. 6 is placed between two concentric rings of differing size to determine equibiaxial flexural strength (i.e., the maximum stress that a material is capable of sustaining when subjected to flexure between two concentric rings). In the RoR configuration 400, the glass ceramic article 410 is supported by a support ring 420 having a diameter D2. A force F is applied by a load cell (not shown) to the surface of the glass ceramic article by a loading ring 430 having a diameter D1.

The ratio of diameters of the loading ring and support ring D1/D2 may be in a range from 0.2 to 0.5. In some embodiments, D1/D2 is 0.5. Loading and support rings 130, 120 should be aligned concentrically to within 0.5% of support ring diameter D2. The load cell used for testing should be accurate to within ±1% at any load within a selected range. Testing is carried out at a temperature of 23±2° C. and a relative humidity of 40±10%.

For fixture design, the radius r of the protruding surface of the loading ring 430 is in a range of h/2≤r≤3h/2, where h is the thickness of glass-based article 410. Loading and support rings 430, 420 are made of hardened steel with hardness HRc>40. RoR fixtures are commercially available.

The intended failure mechanism for the RoR test is to observe fracture of the glass ceramic article 410 originating from the surface 430a within the loading ring 430. Failures that occur outside of this region—i.e., between the loading ring 430 and support ring 420—are omitted from data analysis. Due to the thinness and high strength of the glass ceramic article 410, however, large deflections that exceed ½ of the specimen thickness h are sometimes observed. It is therefore not uncommon to observe a high percentage of failures originating from underneath the loading ring 430. Stress cannot be accurately calculated without knowledge of stress development both inside and under the ring (collected via strain gauge analysis) and the origin of failure in each specimen. RoR testing therefore focuses on peak load at failure as the measured response.

The strength of glass-based article depends on the presence of surface flaws. However, the likelihood of a flaw of a given size being present cannot be precisely predicted, as the strength of glass is statistical in nature. A probability distribution can therefore be used as a statistical representation of the data obtained.

Figure 5:
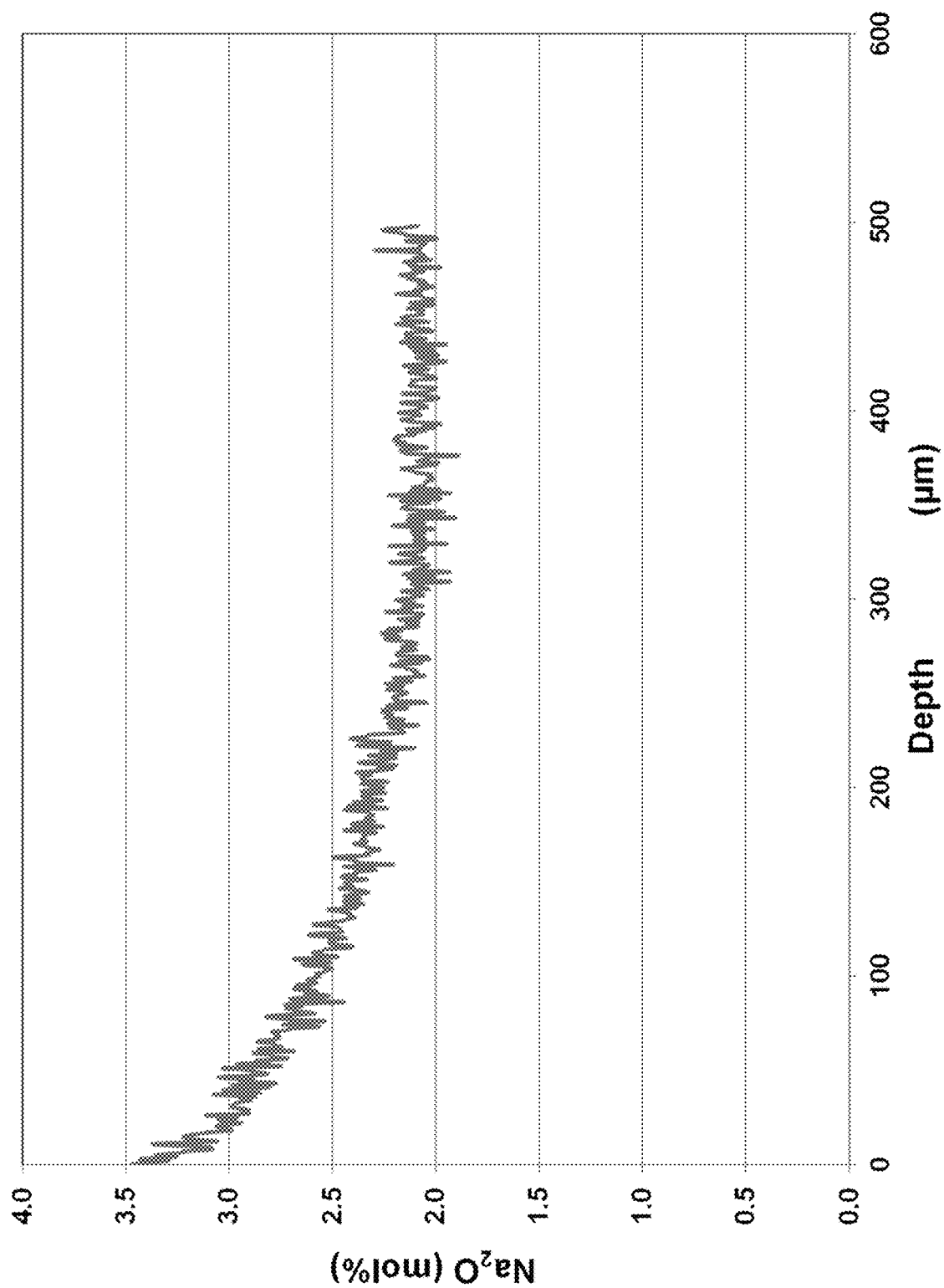
FIG. 5 is an plot of the concentration in wt % of $Na_2O$ as a function of depth from a surface of an ion exchanged glass ceramic according to an embodiment, as measured by electron microprobe.

A sample of Example 3 was ion exchange in a $NaNO_3$ bath at 430° C. for 16 hours. The concentration of $Na_2O$ in the ion exchanged sample as a function of depth below the surface was then measured using an electron microprobe, and the resulting $Na_2O$ concentration profile (in mol %) is shown in FIG. 5.

All compositional components, relationships, and ratios described in this specification are provided in wt % unless otherwise stated. All ranges disclosed in this specification include any and all ranges and subranges encompassed by the broadly disclosed ranges whether or not explicitly stated before or after a range is disclosed.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass ceramic, comprising:
   at least one lithium silicate crystal phase as a primary crystal phase; and
   at least one of petalite, β-quartz, β-spodumene, cristobalite, and lithium phosphate as a secondary crystal phase,
   wherein the glass ceramic is characterized by the following color coordinates:
      L*: 20.0 to 40.0;
      a*: −1.0 to 1.0; and
      b*: −5.0 to 2.0.

2. The glass ceramic of claim 1, wherein the primary crystal phase is a lithium metasilicate.

3. The glass ceramic of claim 1, wherein the primary crystal phase is lithium disilicate.

4. The glass ceramic of claim 1, wherein the glass ceramic has a transmittance of less than 1% in the visible light range.

5. The glass ceramic of claim 1, wherein the glass ceramic has a ring-on-ring strength of at least 290 MPa.

6. The glass ceramic of claim 1, wherein the glass ceramic has a fracture toughness of greater than or equal to 0.9 $MPa \cdot m^{0.5}$ to less than or equal to 2.0 $MPa \cdot m^{0.5}$.

7. The glass ceramic of claim 1, wherein the glass ceramic has a fracture toughness of greater than or equal to 1.0 $MPa \cdot m^{0.5}$ to less than or equal to 1.5 $MPa \cdot m^{0.5}$.

8. The glass ceramic of claim 1, further comprising:
   55.0 wt % to 75.0 wt % $SiO_2$;
   2.0 wt % to 20.0 wt % $Al_2O_3$;
   0 wt % to 5.0 wt % $B_2O_3$;
   5.0 wt % to 15.0 wt % $Li_2O$;
   0 wt % to 5.0 wt % $Na_2O$;
   0 wt % to 4.0 wt % $K_2O$;
   0 wt % to 8.0 wt % MgO;
   0 wt % to 10.0 wt % ZnO;
   0.5 wt % to 5.0 wt % $TiO_2$;
   1.0 wt % to 6.0 wt % $P_2O_5$;
   2.0 wt % to 10.0 wt % $ZrO_2$;
   0 wt % to 0.4 wt % $CeO_2$;
   0.05 wt % to 0.5 wt % $SnO+SnO_2$;
   0.1 wt % to 5.0 wt % $FeO+Fe_2O_3$;
   0.1 wt % to 5.0 wt % NiO;
   0.1 wt % to 5.0 wt % $Co_3O_4$;
   0 wt % to 4.0 wt % $MnO+MnO_2+Mn_2O_3$;
   0 wt % to 2.0 wt % $Cr_2O_3$;
   0 wt % to 2.0 wt % CuO; and
   0 wt % to 2.0 wt % $V_2O_5$.

9. The glass ceramic of claim 1, further comprising:
   65.0 wt % to 75.0 wt % $SiO_2$;
   7.0 wt % to 11.0 wt % $Al_2O_3$;
   6.0 wt % to 11.0 wt % $Li_2O$;
   2.0 wt % to 4.0 wt % $TiO_2$;
   1.5 wt % to 2.5 wt % $P_2O_5$;
   2.0 wt % to 4.0 wt % $ZrO_2$;
   1.0 wt % to 4.0 wt % $FeO+Fe_2O_3$;
   0.5 wt % to 1.5 wt % NiO; and
   0.1 wt % to 0.4 wt % $Co_3O_4$.

10. The glass ceramic of claim 1, wherein the glass ceramic has a crystallinity of greater than 50 wt %.

11. The glass ceramic of claim 1, wherein the glass ceramic is ion exchanged and comprises a compressive stress layer extending from a surface of the glass ceramic to a depth of compression.

12. The glass ceramic of claim 11, wherein the glass ceramic has a compressive stress at the surface of at least 250 MPa.

13. The glass ceramic of claim 11, wherein the glass ceramic has a compressive stress at the surface of greater than or equal to 250 MPa to less than or equal to 650 MPa.

14. The glass ceramic of claim 11, wherein the depth of compression is at least 0.05t, where t is a thickness of glass ceramic.

15. The glass ceramic of claim 11, wherein the glass ceramic has a ring-on-ring strength of at least 900 MPa.

16. A consumer electronic product, comprising:
   a housing comprising a front surface, a back surface and side surfaces;
   electrical components at least partially within the housing, the electrical components comprising at least a controller, a memory, and a display, the display at or adjacent the front surface of the housing; and
   a cover glass disposed over the display,
   wherein at least a portion of the housing comprises the glass ceramic of claim 1.

17. A consumer electronic product, comprising:
   a housing comprising a front surface, a back surface and side surfaces;
   electrical components at least partially within the housing, the electrical components comprising at least a controller, a memory, and a display, the display at or adjacent the front surface of the housing; and
   a cover glass disposed over the display,
   wherein at least a portion of the housing comprises the glass ceramic of claim 11.

18. A method, comprising:
   ceramming a precursor glass-based article to form a glass ceramic,
   wherein the glass ceramic comprises:
      at least one lithium silicate crystal phase as a primary crystal phase; and
      at least one of petalite, β-quartz, β-spodumene, cristobalite, and lithium phosphate as a minor crystal phase, and
      the glass ceramic is characterized by the following color coordinates:
         L*: 20.0 to 40.0;
         a*: −1.0 to 1.0; and
         b*: −5.0 to 2.0.

19. The method of claim 18, wherein the ceramming occurs at a temperature of greater than or equal to 500° C. to less than or equal to 900° C.

20. The method of claim 18, wherein the ceramming occurs for a period of greater than or equal to 6 hours to less than or equal to 16 hours.

21. The method of claim 18, further comprising ion exchanging the glass ceramic.

22. The method of claim 18, wherein the precursor glass-based article comprises:
55.0 wt % to 75.0 wt % $SiO_2$;
2.0 wt % to 20.0 wt % $Al_2O_3$;
0 wt % to 5.0 wt % $B_2O_3$;
5.0 wt % to 15.0 wt % $Li_2O$;
0 wt % to 5.0 wt % $Na_2O$;
0 wt % to 4.0 wt % $K_2O$;
0 wt % to 8.0 wt % MgO;
0 wt % to 10.0 wt % ZnO;
0.5 wt % to 5.0 wt % $TiO_2$;
1.0 wt % to 6.0 wt % $P_2O_5$;
2.0 wt % to 10.0 wt % $ZrO_2$;
0 wt % to 0.4 wt % $CeO_2$;
0.05 wt % to 0.5 wt % $SnO+SnO_2$;
0.1 wt % to 5.0 wt % $FeO+Fe_2O_3$;
0.1 wt % to 5.0 wt % NiO;
0.1 wt % to 5.0 wt % $Co_3O_4$;
0 wt % to 4.0 wt % $MnO+MnO_2+Mn_2O_3$;
0 wt % to 2.0 wt % $Cr_2O_3$;
0 wt % to 2.0 wt % CuO; and
0 wt % to 2.0 wt % $V_2O_5$.

23. The method of claim 18, wherein the precursor glass-based article comprises:
65.0 wt % to 75.0 wt % $SiO_2$;
7.0 wt % to 11.0 wt % $Al_2O_3$;
6.0 wt % to 11.0 wt % $Li_2O$;
2.0 wt % to 4.0 wt % $TiO_2$;
1.5 wt % to 2.5 wt % $P_2O_5$;
2.0 wt % to 4.0 wt % $ZrO_2$;
1.0 wt % to 4.0 wt % $FeO+Fe_2O_3$;
0.5 wt % to 1.5 wt % NiO; and
0.1 wt % to 0.4 wt % $Co_3O_4$.

* * * * *